(12) United States Patent
Meinhold et al.

(10) Patent No.: US 10,584,415 B2
(45) Date of Patent: *Mar. 10, 2020

(54) TEMPERATURE CONTROLLED SHOWERHEAD

(71) Applicant: Novellus Systems, Inc., Fremont, CA (US)

(72) Inventors: Henner Meinhold, Fremont, CA (US); Dan M. Doble, Somerville, MA (US); Stephen Lau, Lake Oswego, OR (US); Vince Wilson, Beaverton, OR (US); Easwar Srinivasan, Beaverton, OR (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/291,822

(22) Filed: Mar. 4, 2019

(65) Prior Publication Data
US 2019/0256977 A1    Aug. 22, 2019

Related U.S. Application Data

(63) Continuation of application No. 15/275,060, filed on Sep. 23, 2016, now Pat. No. 10,221,484, which is a
(Continued)

(51) Int. Cl.
*C23C 16/455* (2006.01)
*C23C 16/509* (2006.01)
*H01J 37/32* (2006.01)

(52) U.S. Cl.
CPC .... *C23C 16/45572* (2013.01); *C23C 16/4557* (2013.01); *C23C 16/45563* (2013.01);
(Continued)

(58) Field of Classification Search
CPC ......... C23C 16/45572; C23C 16/5096; C23C 16/4557; C23C 16/45565; C23C 16/45563; H01J 37/32724; H01J 37/3244
(Continued)

(56) References Cited

U.S. PATENT DOCUMENTS 3,215,508 A    11/1965   Piester
4,577,203 A    3/1986    Kawamura
(Continued)

FOREIGN PATENT DOCUMENTS

CN    1445822 A    10/2003
CN    1802722 A    7/2006
(Continued)

OTHER PUBLICATIONS

U.S. Notice of Allowance dated Jun. 18, 2019 issued in U.S. Appl. No. 14/668,511.
(Continued)

*Primary Examiner* — Rudy Zervigon
(74) *Attorney, Agent, or Firm* — Weaver Austin Villeneuve & Sampson LLP

(57) ABSTRACT

A temperature controlled showerhead for chemical vapor deposition (CVD) chambers enhances heat dissipation to enable accurate temperature control with an electric heater. Heat dissipates by conduction through a showerhead stem and fluid passageway and radiation from a back plate. A temperature control system includes one or more temperature controlled showerheads in a CVD chamber with fluid passageways serially connected to a heat exchanger.

20 Claims, 10 Drawing Sheets

Related U.S. Application Data continuation of application No. 14/169,325, filed on Jan. 31, 2014, now Pat. No. 9,476,120, which is a continuation of application No. 12/181,927, filed on Jul. 29, 2008, now Pat. No. 8,673,080, which is a continuation-in-part of application No. 11/974,966, filed on Oct. 16, 2007, now Pat. No. 8,137,467.

(52) U.S. Cl.
CPC .... *C23C 16/45565* (2013.01); *C23C 16/5096* (2013.01); *H01J 37/3244* (2013.01); *H01J 37/32724* (2013.01)

(58) Field of Classification Search
USPC .................. 118/715; 156/345.34, 345.33
See application file for complete search history.

(56) References Cited

U.S. PATENT DOCUMENTS

| | | | |
|---|---|---|---|
| 4,890,780 A | 1/1990 | Mimata et al. |
| 4,960,488 A | 10/1990 | Law et al. |
| 4,993,485 A | 2/1991 | Gorman |
| 5,106,453 A | 4/1992 | Benko et al. |
| 5,186,756 A | 2/1993 | Benko et al. |
| 5,212,116 A | 5/1993 | Yu |
| 5,232,508 A | 8/1993 | Arena et al. |
| 5,268,034 A | 12/1993 | Vukelic |
| 5,286,519 A | 2/1994 | Vukelic |
| 5,366,557 A | 11/1994 | Yu |
| 5,376,213 A | 12/1994 | Ueda et al. |
| 5,446,824 A | 8/1995 | Moslehi |
| 5,452,396 A | 9/1995 | Sopori |
| 5,453,124 A | 9/1995 | Moslehi et al. |
| 5,468,298 A | 11/1995 | Lei et al. |
| 5,581,874 A | 12/1996 | Aoki et al. |
| 5,589,002 A | 12/1996 | Su |
| 5,614,026 A | 3/1997 | Williams |
| 5,643,394 A | 7/1997 | Maydan et al. |
| 5,653,479 A | 8/1997 | Henderson |
| 5,670,218 A | 9/1997 | Baek |
| 5,741,363 A | 4/1998 | Van Buskirk et al. |
| 5,766,364 A | 6/1998 | Ishida et al. |
| 5,806,980 A | 9/1998 | Berrian |
| 5,834,068 A | 11/1998 | Chern et al. |
| 5,882,411 A | 3/1999 | Zhao et al. |
| 5,948,704 A | 9/1999 | Benjamin et al. |
| 5,950,925 A | 9/1999 | Fukunaga et al. |
| 5,958,140 A | 9/1999 | Arami et al. |
| 5,992,453 A | 11/1999 | Zimmer |
| 5,996,528 A | 12/1999 | Berrian et al. |
| 6,010,748 A | 1/2000 | Van Buskirk et al. |
| 6,022,413 A | 2/2000 | Shinozaki et al. |
| 6,022,586 A | 2/2000 | Hashimoto et al. |
| 6,025,013 A | 2/2000 | Heming et al. |
| 6,054,013 A | 4/2000 | Collins et al. |
| 6,059,885 A | 5/2000 | Ohashi et al. |
| 6,112,697 A | 9/2000 | Sharan et al. |
| 6,190,732 B1 | 2/2001 | Omstead et al. |
| 6,205,869 B1 | 3/2001 | Schadt et al. |
| 6,237,528 B1 | 5/2001 | Szapucki et al. |
| 6,245,192 B1 | 6/2001 | Dhindsa et al. |
| 6,289,842 B1 | 9/2001 | Tompa |
| 6,364,949 B1 | 4/2002 | Or et al. |
| 6,379,056 B1 | 4/2002 | Ueda |
| 6,415,736 B1 | 7/2002 | Hao et al. |
| 6,444,039 B1 | 9/2002 | Nguyen |
| 6,453,992 B1 | 9/2002 | Kim |
| 6,499,425 B1 | 12/2002 | Sandhu et al. |
| 6,537,420 B2 | 3/2003 | Rose |
| 6,565,661 B1 | 5/2003 | Nguyen |
| 6,616,767 B2 | 9/2003 | Zhao et al. |
| 6,716,287 B1 | 4/2004 | Santiago et al. |
| 6,793,733 B2 | 6/2004 | Janakiraman et al. |
| 6,821,347 B2 | 11/2004 | Carpenter et al. |
| 6,883,733 B1 | 4/2005 | Lind |
| 6,921,556 B2 | 7/2005 | Shimizu et al. |
| 6,983,892 B2 | 1/2006 | Noorbakhsh et al. |
| 7,217,326 B2 | 5/2007 | Lee |
| 7,296,534 B2 | 11/2007 | Fink |
| D593,640 S | 6/2009 | Schoenherr et al. |
| 7,682,946 B2 | 3/2010 | Ma et al. |
| 7,712,434 B2 | 5/2010 | Dhindsa et al. |
| 7,737,035 B1 | 6/2010 | Laid et al. |
| 7,993,457 B1 | 8/2011 | Krotov et al. |
| 8,137,467 B2 | 3/2012 | Meinhold et al. |
| 8,187,679 B2 | 5/2012 | Dickey et al. |
| 8,443,756 B2 | 5/2013 | Fischer et al. |
| 8,562,785 B2 | 10/2013 | Kang et al. |
| 8,673,080 B2 | 3/2014 | Meinhold et al. |
| 8,728,956 B2 | 5/2014 | LaVoie et al. |
| 8,980,006 B2 | 3/2015 | Huh et al. |
| 9,017,481 B1 | 3/2015 | Pettinger et al. |
| 9,034,142 B2 | 5/2015 | Bartlett et al. |
| 9,314,854 B2 | 4/2016 | Huang et al. |
| 9,441,296 B2 | 9/2016 | Sabri et al. |
| 9,449,795 B2 | 9/2016 | Sabri et al. |
| 9,476,120 B2 | 10/2016 | Meinhold et al. |
| 9,793,096 B2 | 10/2017 | Kang et al. |
| 10,023,959 B2 | 7/2018 | Sung et al. |
| 10,221,484 B2 | 3/2019 | Meinhold et al. |
| 10,378,107 B2 | 8/2019 | Chandrasekharan et al. |
| 10,400,333 B2 | 9/2019 | Sabri et al. |
| 2001/0027026 A1 | 10/2001 | Dhindsa et al. |
| 2001/0035127 A1 | 11/2001 | Metzner et al. |
| 2002/0017243 A1 | 2/2002 | Pyo |
| 2002/0069969 A1 | 6/2002 | Rose |
| 2002/0123230 A1 | 9/2002 | Hubacek |
| 2002/0134507 A1 | 9/2002 | DeDontney et al. |
| 2002/0144783 A1 | 10/2002 | Tran et al. |
| 2002/0144785 A1 | 10/2002 | Srivastava et al. |
| 2003/0010452 A1 | 1/2003 | Park et al. |
| 2003/0051665 A1 | 3/2003 | Zhao et al. |
| 2003/0054099 A1 | 3/2003 | Jurgensen et al. |
| 2003/0066607 A1 | 4/2003 | White et al. |
| 2003/0106490 A1 | 6/2003 | Jallepally et al. |
| 2003/0168001 A1 | 9/2003 | Sneh |
| 2003/0170388 A1 | 9/2003 | Shirniki et al. |
| 2004/0003777 A1 | 1/2004 | Carpenter et al. |
| 2004/0005731 A1 | 1/2004 | Jurgensen et al. |
| 2004/0023461 A1 | 2/2004 | Ahn et al. |
| 2004/0050325 A1 | 3/2004 | Samoilov et al. |
| 2004/0050326 A1 | 3/2004 | Thilderkvist et al. |
| 2004/0050496 A1 | 3/2004 | Iwai et al. |
| 2004/0134611 A1 | 7/2004 | Kato et al. |
| 2004/0149215 A1 | 8/2004 | Shao et al. |
| 2004/0200412 A1 | 10/2004 | Frijlink |
| 2004/0200413 A1 | 10/2004 | Lee |
| 2004/0231799 A1 | 11/2004 | Lee et al. |
| 2004/0235299 A1 | 11/2004 | Srivastava et al. |
| 2004/0238123 A1 | 12/2004 | Becknell et al. |
| 2005/0000423 A1 | 1/2005 | Kasai et al. |
| 2005/0000442 A1 | 1/2005 | Hayashi et al. |
| 2005/0017100 A1 | 1/2005 | Watanabe et al. |
| 2005/0022748 A1 | 2/2005 | Gabriel et al. |
| 2005/0145338 A1 | 7/2005 | Park et al. |
| 2005/0173404 A1 | 8/2005 | Benjamin et al. |
| 2005/0173569 A1 | 8/2005 | Noorbakhsh et al. |
| 2005/0181617 A1 | 8/2005 | Bosch |
| 2005/0205110 A1 | 9/2005 | Kao et al. |
| 2005/0218507 A1 | 10/2005 | Kao et al. |
| 2005/0221552 A1 | 10/2005 | Kao et al. |
| 2005/0230350 A1 | 10/2005 | Kao et al. |
| 2005/0241765 A1 | 11/2005 | Dhindsa et al. |
| 2005/0241766 A1 | 11/2005 | Dhindsa et al. |
| 2005/0242061 A1 | 11/2005 | Fukuda |
| 2005/0284372 A1 | 12/2005 | Murugesh et al. |
| 2006/0005767 A1 | 1/2006 | Tsai et al. |
| 2006/0046470 A1 | 3/2006 | Becknell et al. |
| 2006/0112876 A1 | 6/2006 | Choi et al. |
| 2006/0137607 A1 | 6/2006 | Seo et al. |
| 2007/0116872 A1 | 5/2007 | Li et al. |
| 2007/0116873 A1 | 5/2007 | Li et al. |
| 2007/0119371 A1 | 5/2007 | Ma et al. |

(56) References Cited

U.S. PATENT DOCUMENTS

| | | |
|---|---|---|
| 2007/0128862 A1 | 6/2007 | Ma et al. |
| 2007/0128863 A1 | 6/2007 | Ma et al. |
| 2007/0128864 A1 | 6/2007 | Ma et al. |
| 2007/0145021 A1 | 6/2007 | Wang et al. |
| 2007/0157683 A1 | 7/2007 | Li |
| 2007/0212484 A1 | 9/2007 | Li |
| 2007/0246163 A1 | 10/2007 | Paterson et al. |
| 2007/0248515 A1 | 10/2007 | Tompa et al. |
| 2007/0275569 A1 | 11/2007 | Moghadam et al. |
| 2007/0286967 A1 | 12/2007 | Ide et al. |
| 2008/0006208 A1 | 1/2008 | Ueno et al. |
| 2008/0016684 A1 | 1/2008 | Olechnowicz et al. |
| 2008/0053614 A1 | 3/2008 | Sago et al. |
| 2008/0081124 A1 | 4/2008 | Johanson et al. |
| 2008/0085226 A1 | 4/2008 | Fondurulia et al. |
| 2008/0093341 A1 | 4/2008 | Turlot et al. |
| 2008/0099145 A1 | 5/2008 | Keller |
| 2008/0141941 A1 | 6/2008 | Augustino et al. |
| 2008/0241379 A1 | 10/2008 | Suzuki et al. |
| 2008/0241517 A1 | 10/2008 | Kenworthy et al. |
| 2008/0242085 A1 | 10/2008 | Fischer et al. |
| 2008/0308228 A1 | 12/2008 | Stevenson et al. |
| 2009/0000743 A1 | 1/2009 | Iizuka |
| 2009/0017227 A1 | 1/2009 | Fu et al. |
| 2009/0081878 A1 | 3/2009 | Dhindsa |
| 2009/0095218 A1 | 4/2009 | Meinhold et al. |
| 2009/0095219 A1 | 4/2009 | Meinhold et al. |
| 2009/0095220 A1 | 4/2009 | Meinhold et al. |
| 2009/0095621 A1 | 4/2009 | Kao et al. |
| 2009/0211085 A1 | 8/2009 | Kennedy et al. |
| 2009/0260571 A1 | 10/2009 | Ostrowski et al. |
| 2009/0305509 A1 | 12/2009 | Stevenson et al. |
| 2010/0167551 A1 | 7/2010 | DeDontney et al. |
| 2010/0184298 A1 | 7/2010 | Dhindsa |
| 2010/0206376 A1 | 8/2010 | You et al. |
| 2010/0230387 A1 | 9/2010 | Okesaku et al. |
| 2010/0261354 A1 | 10/2010 | Bettencourt et al. |
| 2010/0263588 A1 | 10/2010 | Zhiyin |
| 2010/0272895 A1 | 10/2010 | Tsuda |
| 2010/0276084 A1 | 11/2010 | Yao |
| 2010/0279008 A1 | 11/2010 | Takagi |
| 2010/0288439 A1 | 11/2010 | Ishibashi et al. |
| 2011/0011338 A1 | 1/2011 | Chuc et al. |
| 2011/0048642 A1 | 3/2011 | Mihara et al. |
| 2011/0052833 A1 | 3/2011 | Hanawa et al. |
| 2011/0076401 A1 | 3/2011 | Chao et al. |
| 2011/0146571 A1 | 6/2011 | Bartlett et al. |
| 2011/0159690 A1 | 6/2011 | Chandrashekar et al. |
| 2011/0256726 A1 | 10/2011 | LaVoie et al. |
| 2011/0300716 A1 | 12/2011 | Park et al. |
| 2012/0077349 A1 | 3/2012 | Li et al. |
| 2012/0090691 A1 | 4/2012 | Baluja et al. |
| 2012/0156877 A1 | 6/2012 | Yap et al. |
| 2012/0156880 A1 | 6/2012 | Panagopoulos |
| 2012/0174866 A1 | 7/2012 | Huh et al. |
| 2012/0222815 A1 | 9/2012 | Sabri et al. |
| 2012/0227665 A1 | 9/2012 | Ozgun et al. |
| 2012/0264051 A1 | 10/2012 | Angelov et al. |
| 2012/0269968 A1 | 10/2012 | Rayner, Jr. |
| 2012/0305190 A1 | 12/2012 | Kang et al. |
| 2012/0309204 A1 | 12/2012 | Kang et al. |
| 2013/0034967 A1 | 2/2013 | Bettencourt et al. |
| 2013/0220975 A1 | 8/2013 | Dhindsa |
| 2013/0299605 A1 | 11/2013 | Ehrlich et al. |
| 2013/0341433 A1 | 12/2013 | Roy et al. |
| 2014/0061324 A1 | 3/2014 | Mohn et al. |
| 2014/0103145 A1 | 4/2014 | White et al. |
| 2014/0103806 A1 | 4/2014 | Kellogg et al. |
| 2014/0158792 A1 | 6/2014 | Meinhold et al. |
| 2014/0179114 A1 | 6/2014 | van Schravendijk |
| 2014/0235069 A1 | 8/2014 | Breiling et al. |
| 2014/0238608 A1 | 8/2014 | Sabri et al. |
| 2014/0299681 A1 | 10/2014 | Kashyap et al. |
| 2014/0306027 A1 | 10/2014 | Xu et al. |
| 2015/0004798 A1 | 1/2015 | Chandrasekharan et al. |
| 2015/0007770 A1 | 1/2015 | Chandrasekharan et al. |
| 2015/0011095 A1 | 1/2015 | Chandrasekharan et al. |
| 2015/0011096 A1 | 1/2015 | Chandrasekharan et al. |
| 2015/0187568 A1 | 7/2015 | Pettinger et al. |
| 2015/0218701 A1 | 8/2015 | Bartlett et al. |
| 2015/0315706 A1 | 11/2015 | Chandrasekharan et al. |
| 2015/0377481 A1 | 12/2015 | Smith et al. |
| 2016/0079036 A1 | 3/2016 | Kang et al. |
| 2016/0340782 A1 | 11/2016 | Chandrasekharan et al. |
| 2016/0343595 A1 | 11/2016 | Lind et al. |
| 2016/0348242 A1 | 12/2016 | Sung et al. |
| 2016/0348244 A1 | 12/2016 | Sabri et al. |
| 2017/0009344 A1 | 1/2017 | Meinhold et al. |
| 2018/0340256 A1 | 11/2018 | Sung et al. |

FOREIGN PATENT DOCUMENTS

| | | |
|---|---|---|
| CN | 2893917 Y | 4/2007 |
| CN | 101101887 A | 1/2008 |
| CN | 100487857 C | 5/2009 |
| CN | 101448977 A | 6/2009 |
| CN | 201343570 Y | 11/2009 |
| CN | 200820135478.5 | 11/2009 |
| CN | 101916715 A | 12/2010 |
| CN | 102102194 A | 6/2011 |
| CN | 102132383 A | 7/2011 |
| CN | 202025711 U | 11/2011 |
| CN | 103403843 A | 11/2013 |
| CN | 103521956 A | 1/2014 |
| CN | 103890911 A | 6/2014 |
| EP | 0 462 730 A1 | 12/1991 |
| EP | 1568797 A2 | 8/2005 |
| JP | 07-045542 | 2/1995 |
| JP | 2002-033311 A | 1/2002 |
| JP | 3147392 | 12/2008 |
| JP | 2014-070249 A | 4/2014 |
| JP | 5468735 B2 | 4/2014 |
| JP | 2014-078685 A | 5/2014 |
| KR | 10-2010-0134215 A | 12/2010 |
| KR | 20-0454281 | 6/2011 |
| SG | 152163 | 5/2011 |
| TW | 300319 B | 3/1997 |
| TW | 200610033 A | 3/2006 |
| TW | 200923126 | 6/2009 |
| TW | 200924049 A | 6/2009 |
| TW | M361710 | 7/2009 |
| TW | 201132793 | 10/2011 |
| TW | 201411761 A | 3/2014 |
| TW | 201502310 A | 1/2015 |
| TW | 201509537 A | 3/2015 |
| WO | WO 00/42236 A2 | 7/2000 |
| WO | WO 2004/107413 A2 | 12/2004 |
| WO | WO 2005/103323 A1 | 11/2005 |
| WO | WO 2006/022997 A2 | 3/2006 |
| WO | WO 2007/060143 A1 | 5/2007 |
| WO | WO 2007/142690 A2 | 12/2007 |
| WO | WO 2008/042032 | 4/2008 |
| WO | WO 2009/055244 A1 | 4/2009 |
| WO | WO 2009/089794 A1 | 7/2009 |
| WO | WO 2012/122054 | 9/2012 |
| WO | WO 2012/166362 | 12/2012 |

OTHER PUBLICATIONS

U.S. Notice of Allowance dated Mar. 21, 2019 issued in U.S. Appl. No. 14/850,816.
U.S. Office Action dated Jun. 15, 2018, issued in U.S. Appl. No. 15/275,060.
U.S. Notice of Allowance dated Oct. 19, 2018, issued in U.S. Appl. No. 15/275,060.
U.S. Notice of allowance dated Mar. 22, 2019 issued in U.S. Appl. No. 16/035,491.
U.S. Notice of Allowance dated Jul. 30, 2019 issued in U.S. Appl. No. 16/035,491.
Taiwan First Office Action dated Feb. 27, 2019, issued in Application No. TW 104114093.
Chinese Second Office Action dated Apr. 10, 2019, issued in Application No. CN 201610345779.X.

(56) References Cited

OTHER PUBLICATIONS

Japanese Office Action, dated Mar. 19, 2019, issued in Application No. JP 2015-090931.
Taiwanese First Office Action dated Aug. 7, 2019 issued in Application No. TW 105116200.
U.S. Office Action, dated Jul. 27, 2017, issued in U.S. Appl. No. 14/668,511.
U.S. Applicant Initiated Interview Summary, dated Nov. 1, 2017, issued in U.S. Appl. No. 14/668,511.
U.S. Final Office Action, dated Feb. 7, 2018, issued in U.S. Appl. No. 14/668,511.
U.S. Office Action Interview Summary, dated May 23, 2018, issued in U.S. Appl. No. 14/668,511.
U.S. Office Action dated Nov. 29, 2018 issued in U.S. Appl. No. 14/668,511.
U.S. Office Action, dated Sep. 14, 2017, issued in U.S. Appl. No. 14/716,823.
U.S. Final Office Action dated May 18, 2018, issued in U.S. Appl. No. 14/716,823.
U.S. Office Action Interview Summary dated Jul. 18, 2018, issued in U.S. Appl. No. 14/716,823.
U.S. Office Action, dated Apr. 4, 2018, issued in U.S. Appl. No. 14/850,816.
U.S. Final Office Action dated Oct. 18, 2018 issued in U.S. Appl. No. 14/850,816.
U.S. Office Action, dated Sep. 17, 2010, issued in U.S. Appl. No. 11/974,966.
U.S. Final Office Action, dated Mar. 21, 2011, issued in U.S. Appl. No. 11/974,966.
U.S. Office Action, dated Sep. 2, 2011, issued in U.S. Appl. No. 11/974,966.
U.S. Notice of Allowance, dated Jan. 6, 2012, issued in U.S. Appl. No. 11/974,966.
U.S. Office Action, dated Sep. 17, 2010, issued in U.S. Appl. No. 12/181,927.
U.S. Final Office Action, dated Mar. 28, 2011, issued in U.S. Appl. No. 12/181,927.
U.S. Examiner's Answer, dated Dec. 21, 2011, issued in U.S. Appl. No. 12/181,927.
U.S. Patent Board Decision on Appeal dated Aug. 19, 2013 issued in U.S. Appl. No. 12/181,927.
U.S. Notice of Allowance, dated Oct. 25, 2013, issued in U.S. Appl. No. 12/181,927.
U.S. Office Action, dated Mar. 11, 2016, issued in U.S. Appl. No. 14/169,325.
U.S. Notice of Allowance, dated Jun. 22, 2016, issued in U.S. Appl. No. 14/169,325.
U.S. Miscellaneous Communication, dated Jul. 11, 2016, issued in U.S. Appl. No. 14/169,325.
U.S. Office Action, dated Sep. 17, 2010, issued in U.S. Appl. No. 11/974,945.
U.S. Final Office Action, dated Mar. 21, 2011, issued in U.S. Appl. No. 11/974,945.
U.S. Office Action, dated Aug. 17, 2011, issued in U.S. Appl. No. 12/148,267.
U.S. Final Office Action, dated Jan. 30, 2012, issued in U.S. Appl. No. 12/148,267.
U.S. Office Action, dated Nov. 8, 2012, issued in U.S. Appl. No. 12/642,497.
U.S. Final Office Action, dated Apr. 8, 2013, issued in U.S. Appl. No. 12/642,497.
U.S. Office Action, dated Jul. 12, 2013, issued in U.S. Appl. No. 12/642,497.
U.S. Final Office Action, dated Nov. 6, 2013, issued in U.S. Appl. No. 12/642,497.
U.S. Office Action, dated Sep. 24, 2014, issued in U.S. Appl. No. 12/642,497.
U.S. Notice of Allowance, dated Jan. 15, 2015, issued in U.S. Appl. No. 12/642,497.
U.S. Office Action, dated May 3, 2017, issued in U.S. Appl. No. 14/687,134.
U.S. Final Office Action, dated Jul. 20, 2017, issued in U.S. Appl. No. 14/687,134.
U.S. Office Action, dated Apr. 21, 2010, issued in U.S. Appl. No. 11/542,959.
U.S. Final Office Action, dated Oct. 28, 2010, issued in U.S. Appl. No. 11/542,959.
U.S. Office Action, dated Feb. 16, 2011, issued in U.S. Appl. No. 11/542,959.
U.S. Final Office Action, dated Jul. 21, 2011, issued in U.S. Appl. No. 11/542,959.
U.S. Notice of Allowance dated Mar. 8, 2018, issued in U.S. Appl. No. 15/163,594.
U.S. Office Action dated Nov. 28, 2018, issued in U.S. Appl. No. 16/035,491.
Chinese First Office Action, dated Apr. 19, 2017, issued in Application No. CN 201510221479.6.
Chinese Second Office Action, dated Nov. 16, 2017, issued in Application No. CN 201510221479.6.
Chinese Third Office Action, dated May 15, 2018, issued in Application No. CN 201510221479.6.
Chinese First Office Action, dated May 17, 2018, issued in Application No. CN 201610345779.X.
Chinese Office Action, dated May 12, 2009, issued in Application No. CN 200820135478.5.
Korean Office Action, dated Dec. 31, 2010, issued in Application No. KR 2008-0013796.
SG Search and Examination Report, dated May 3, 2010, issued in Application No. SG 2008/07575-6.
Chinese First Office Action, dated Feb. 8, 2014, issued in Application No. CN 201010602102.2.
Chinese Second Office Action, dated Aug. 29, 2014, issued in Application No. CN 201010602102.2.
Singapore Search and Examination Report, dated Mar. 5, 2012, issued in Application No. SG 201009408-4.
Korean First Office Action, dated Dec. 12, 2016, issued in Application No. KR 2010-0129965.
Taiwan Office Action, dated Mar. 26, 2015, issued in Application No. TW 099144608.
Taiwan Office Action, dated May 17, 2016, issued in Application No. TW104138639.
PCT International Search Report and Written Opinion dated Sep. 27, 2012 issued in PCT/US2012/027596.
PCT International Report on Patentability dated Sep. 19, 2013 issued in PCT/US2012/027596.
PCT International Search Report and Written Opinion dated Jan. 10, 2008, issued in PCT/US2007/015979.
PCT International Preliminary Report on Patentability and Written Opinion dated Apr. 7, 2009, issued in PCT/US2007/015979.
Chinese First Office Action dated Apr. 10, 2018 issued in Application No. CN 201610361563.2.
Novellus, XL*, High Vacuum Angle Valve, Air Operated, Lam Research, DOC-3076a, Document Control Released Oct. 25, 2012, 5 pages.
Mohamed Sabri et al., "Ceramic Showerhead with Embedded RF Electrode for Capacitively Coupled Plasma Reactor," filed Feb. 28, 2013, pp. 1-37.

TEMPERATURE CONTROLLED SHOWERHEAD

CROSS REFERENCE TO RELATED APPLICATIONS

This application is a continuation under 35 U.S.C. § 120 of U.S. patent application Ser. No. 15/275,060 entitled "TEMPERATURE CONTROLLED SHOWERHEAD" and filed Sep. 23, 2016, naming Meinhold et al. as inventors, which is itself a continuation of U.S. patent application Ser. No. 14/169,325 entitled "TEMPERATURE CONTROLLED SHOWERHEAD" and filed Jan. 31, 2014, naming Meinhold et al. as inventors, which is itself a continuation of U.S. patent application Ser. No. 12/181,927, entitled "TEMPERATURE CONTROLLED SHOWERHEAD" and filed Jul. 29, 2008, naming Meinhold et al. as inventors, which is itself a continuation-in-part of U.S. patent application Ser. No. 11/974,966, entitled "TEMPERATURE CONTROLLED SHOWERHEAD" and filed Oct. 16, 2007, naming Meinhold et al. as inventors, all of which are hereby incorporated herein by reference in their entirety and for all purposes.

FIELD OF THE INVENTION

The present invention pertains to apparatus and systems for depositing films on a substrate. Specifically, the invention pertains to a chemical vapor deposition (CVD) apparatus for injecting gases into a reaction chamber. Even more specifically, the invention pertains to a temperature controlled showerhead and its temperature control system.

BACKGROUND

CVD showerhead reactors employ a perforated or porous planar surface to dispense reactant and carrier gases as uniformly as possible over a second parallel planar surface. This configuration can be used for continuous batch processing of multiple substrates or processing of single round wafers. Wafers are generally heated to a process temperature at which the reactant gases react and deposit a film on the wafer surface.

Showerhead reactors, or parallel-plate reactors, lend themselves to implementation of plasma-enhanced processes, e.g., plasma-enhanced chemical vapor deposition (PECVD). In most PECVD reactors the top and bottom electrodes are about the same size. The wafer electrode may be a substrate support and be grounded and the showerhead may have RF power applied. Bias RF power may be applied to the substrate support. The applied RF in the showerhead may necessitate insulating sections in the gas supply system to avoid creating a parasitic discharge in the gas feed lines to the chamber. RF power may be applied through the substrate support electrode, while the showerhead may be grounded.

Wafer-to-wafer uniformity may be affected by varying reaction temperature from wafer-to-wafer: process conditions, clean cycles, idling time, and change in emissivity of the showerhead components over time can all affect the substrate or wafer as well as the gas reaction temperature. Although after a number of wafers in continuous batch processing the showerheads eventually reach an equilibrium temperature, these factors can affect the equilibrium temperature or the number of deposition cycles before the equilibrium temperature is reached. Also, in a multiple station chamber, showerhead temperature may vary from station to station. For example, the cool incoming wafers at station 1 may lead to a progressive cooling of the showerhead. The thermal cycle of showerheads may also create particles from coatings on the showerhead having different coefficients of thermal expansion from the showerhead itself.

It is therefore desirable to accurately control the temperature of each showerhead in a chamber to create a manufacturing-worthy equipment with best wafer-to-wafer uniformity. The showerhead should be designed without creating particles and be manufacturable at the lowest cost without increasing footprint or reducing throughput while maintaining good wafer-to-wafer uniformity.

SUMMARY OF THE INVENTION

A temperature controlled CVD showerhead and temperature control system with enhanced heat dissipation enable accurate and stable temperature control with fast response. Accurate temperature control reduces wafer-to-wafer non-uniformity within continuous batch processing and from batch to batch. The enhanced heat dissipation and heater enable quick recovery to the temperature set point when changes in the operating environment perturb the system. Increased heat dissipation is achieved by increased conduction through the showerhead stem, additional convective cooling using a fluid in a fluid passageway and increased radiation from a back plate. The temperature control system also includes a heat exchanger that serially cools the convective cooling fluid flowing in the showerhead fluid passageway. In addition, the showerhead temperature may provide an additional parameter for process optimization.

In one aspect, the present invention pertains to a temperature controlled CVD showerhead that includes a stem with a convective cooling fluid passageway, a back plate thermally coupled to the stem, a heater physically attached to the back plate, a face plate thermally coupled to the back plate, and a temperature sensor for measuring a temperature of the face plate. The temperature sensor may be a thermocouple attached to the face plate. A non-contact method for temperature measurement, based on infra-red radiation, fluorescence or pyrometry may also be employed. The back plate may be made of aluminum or an alloy of aluminum. The external surface of the back plate may be coated with a material to increase emissivity. The coating may be anodized aluminum. The heater may be an electrical resistance heater and may be embedded in the back plate. The face plate may be made of aluminum, anodized or coated aluminum, or other metal that is formulated to be high temperature, chemical and plasma resistant.

The stem houses a channel through which reactant and carrier gases flow to the face plate, where the gases are distributed through holes or perforations in the face plate. A baffle plate or some other distribution device may be located between the end of the gas channel and the face plate to help distribute the gas evenly. The stem also houses a convective cooling fluid passageway through which cooling fluid may flow to cool the showerhead. The fluid passageway is constructed so that it is isolated from the reactant channel in the stem carrying reactant and carrier gases to the showerhead. The convective cooling fluid enters the stem at an inlet and may exit the stem through one or more exit channels. In the stem, the inlet or the outlet channel or both channels of the passageway may follow a helical path or some other tortuous path designed for conductive heat transfer between the fluid and the surface. The cooling fluid may be clean dry air (CDA), argon, helium, nitrogen, hydrogen, or a mixture of these. Though not preferred, water and oil based liquid coolant may be used as the convective cooling fluid. Particularly, the CDA may be supplied by fab facilities at a pressure of about 50-100 psi. The CDA may also be cooled by a heat exchanger connected to more than one showerhead serially. Serial cooling means that the CDA may be supplied to various showerheads with intermediate cooling by the heat exchanger. For example, the CDA may be supplied to a first showerhead, cooled by the heat exchanger, supplied to a second showerhead, cooled by the heat exchanger, supplied to a third showerhead, cooled by the heat exchanger, supplied to a fourth showerhead, cooled by the heat exchanger, and exhausted. This arrangement minimizes the amount of air used and also ensures a low temperature of the exhaust, eliminating safety hazards.

The face plate contains holes or perforations through which gas reactants flow to the wafer. The face plate may have various configuration of hole patterns of difference sizes. The face plate may be removably attached to the back plate so as to facilitate cleaning or changing hole patterns. The temperature of the face plate may be measured by a thermocouple in physical and thermal contact with the face plate, or by other means that are less susceptible to RF interferences, such as optical thermometry. If a thermocouple is used, it may be connected to the face plate through a standoff between the back plate and the face plate and through the stem. A radio frequency (RF) filter may be electrically coupled to the thermocouple to reduce or eliminate interference in the temperature signal from the applied RF to the showerhead.

An RF filter may be also electrically coupled to the heater. One or both of the heater and the thermocouple may be isolated from RF power of certain frequency used during deposition. A controller may be coupled to the thermocouple and the heater to maintain desired temperature at the face plate.

In another aspect, the present invention pertains to a temperature control system for controlling one or more showerhead temperatures in a CVD chamber. The system includes a CVD chamber and a cooling system. The CVD chamber includes one or more temperature controlled showerheads. Each showerhead includes a stem, a back plate, a face plate, and a thermocouple for measuring the temperature of the face plate. The stem includes a convective cooling fluid passageway and is thermally coupled to the back plate, which is thermally coupled to the face plate. The cooling system is connected to the convective cooling fluid passageways in each showerhead to serial flow cooling fluid through each showerhead and through the heat exchanger in between showerheads. The cooling system may include a liquid cooled heat exchanger and connections to the convective cooling fluid passageways. The temperature control system may also include a controller coupled to the thermocouple and a heater physically attached to the back plate.

The convective cooling fluid may be clean dry air (CDA), argon, helium, nitrogen, hydrogen, or a combination of these. The convective cooling fluid may be delivered via a fab facilities connection and may be CDA. The CDA may be delivered at a pressure of about 50-100 psi and ambient temperature to the first showerhead stem. The CDA may be serially cooled between cooling different showerheads, which may or may not be in the same process chamber on the same tool. One heat exchanger may be used to cool showerheads in more than one chamber for more than one tool. The CDA may be finally exhausted at ambient pressure and/or ambient temperature after a last cooling. The liquid coolant in the heat exchanger may be facilities water or another liquid coolant. The heat exchanger may be a cast metal block having embedded coolant line and convective cooling fluid lines. The cast metal material may be aluminum. The cooling system may also include one or more bypass loops configured to isolate one or more showerheads from the cooling system. The cooling system may also include flow modulators, coupled to the controller, to regulate or control the flowrate of cooling fluids into each showerhead so as to control the amount of cooling. In some embodiments, the CVD chamber may also include a chamber top that has a high-emissivity coating. The coating may be on the inside surface of the chamber top and may be anodized aluminum.

In yet another aspect, the present invention pertains to a temperature control system for controlling CVD showerhead temperature. The system includes cooling means thermally coupled to the showerhead; heating means thermally coupled to the showerhead; temperature sensing means thermally coupled a face of the showerhead; RF filtering means electrically coupled to the temperature sensing means and heating means; and, controlling means for controlling temperature. The system may also include radiative cooling means and convective cooling means.

In one aspect, the present invention pertains to a temperature controlled CVD showerhead that includes a stem with a convective cooling fluid passageway, a back plate thermally coupled to the stem, and a face plate thermally coupled to the back plate. The convective cooling fluid passageway may be designed such that cooling fluid exiting the passageway would be at the same temperature as the showerhead. The showerhead apparatus may also include a temperature sensor for measuring the exit cooling fluid temperature that is outside of the plasma RF interference range. The temperature sensor may be a thermocouple or a non-contact method for temperature measurement, based on infra-red radiation, fluorescence or pyrometry. The back plate may be made of aluminum or an alloy of aluminum. The external surface of the back plate may be coated with a material to increase emissivity. The coating may be anodized aluminum. In some embodiment, a heater may be attached to the back plate, which may be an electrical resistance heater and may be embedded in the back plate.

In another aspect, the present invention pertains to a temperature control system for controlling showerhead temperatures in a CVD chamber. The system may include a CVD chamber with one or more temperature controlled showerheads, a cooling system fluidly coupled to the convective cooling fluid passageways, and a controller. Each showerhead may include a stem having a convective fluid passageway, a back plate thermally coupled to the stem, and a face plate thermally coupled to the back plate. The cooling system may include inlets and outlets to the convective cooling fluid passageways, a liquid cooled heat exchanger, flow modulators, and a temperature sensor thermally coupled to a convective cooling fluid exiting the stem. The heat exchanger may remove heat from the convective cooling fluid that flows serially through the passageways of the one more showerheads and is intermediately cooled by the heat exchanger. The flow modulators may control the flow rate of the convective cooling fluid to each showerhead based on information from the controller. The temperature sensor may measure the temperature of the fluid exiting a showerhead so that the controller may determine a temperature of the face plate. The controller may be coupled to the flow modulator and the temperature sensor so as to determine and control the face plate temperature. In some cases, a heater may be attached to the back plate and coupled to the controller to provide heating.

In yet another aspect, the present invention pertains to a temperature controlled showerhead face plate for CVD. The face plate includes a substantially planar and circular front surface and back surface. The back surface may include a number of threaded blind holes and one or more mating features for attaching the face plate to the back plate. The face plate may also include a number of small through holes for gas flow from the showerhead stem to the processing area on the other side of the face plate. The small through holes may be about 100-10,000, 2-5000, about 3-4000, or about 200-2000 holes having a diameter of about 0.01 to 0.5 inch or about 0.04 inch and may form a pattern of non-uniform hole density. The face plate may have a thickness of about 0.25 to 0.5 inches, or about 0.125 to 0.5 inches, or about 0.25-0.375 inches and may be made of an aluminum, anodized or coated aluminum, or other metal that is formulated to be high temperature, chemical and plasma resistant. A thermocouple contact hole may also be included. The face plate is configured to be removably attached to the back plate via the one or more mating features. The mating feature may be a circumferential sidewall above the back surface, a groove, a number of threaded blind holes, and a half of an interlocking jaw.

These and other features and advantages of the invention will be described in more detail below with reference to the associated drawings.

DETAILED DESCRIPTION OF SPECIFIC EMBODIMENTS

Introduction

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

In this application, the terms "substrate" and "wafer" will be used interchangeably. The following detailed description assumes the invention is implemented on semiconductor processing equipment. However, the invention is not so limited. The apparatus may be utilized to process work pieces of various shapes, sizes, and materials. In addition to semiconductor wafers, other work pieces that may take advantage of this invention include various articles such as display face planes printed circuit boards and the like.

Figure 1:
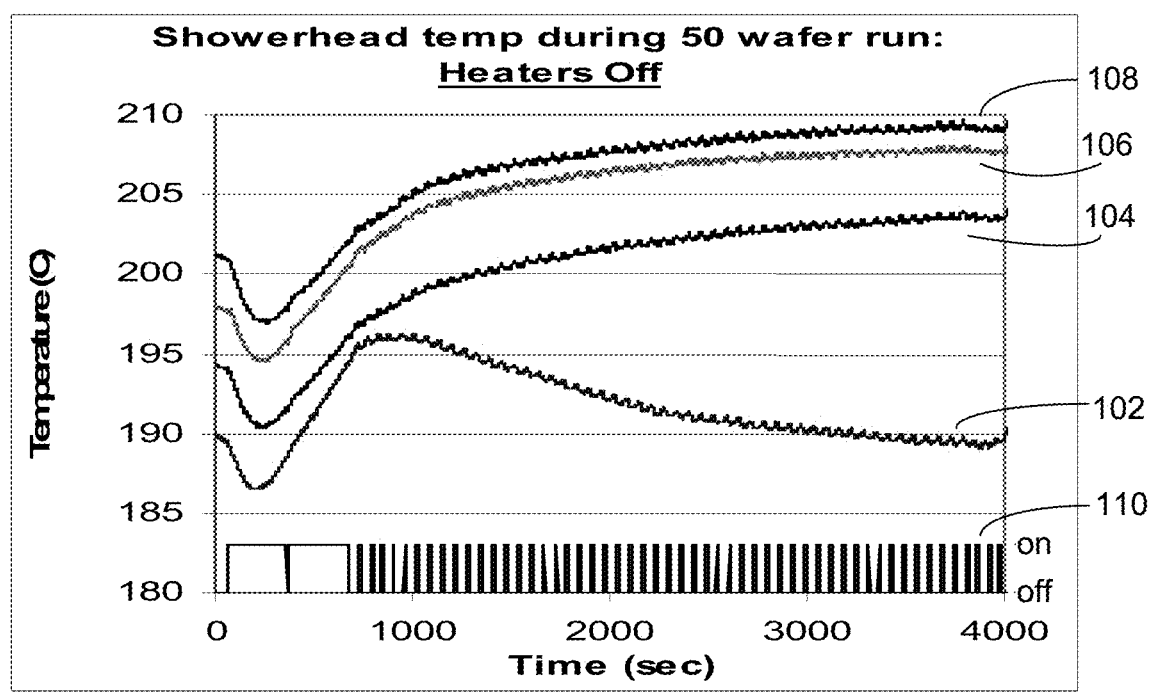
FIG. 1 is a graph of showerhead temperatures in a four station chamber over time.

Showerhead temperatures drift over time and affects deposition reaction in terms of reaction rates and film properties. FIG. 1 is a graph of 4 showerhead temperatures over a 50 wafer run without any temperature control, i.e., no heating or cooling. Four showerheads in a four-station chamber are plotted over a 50 wafer run for about 4000 seconds. The station 1 showerhead corresponds to line 102; station 2 to line 104; station 3 to line 106; and, station 4 to line 108. As time goes on, the temperature in stations 2-4 increases until it reaches a steady state temperature at about 3700 seconds. The plasma condition is plotted as a step function at line 110. Initially, the plasma remains on in a dummy deposition mode to warm up the showerheads and after about 10 minutes, the wafers processing started. In station 1, the temperature started to decrease gradually after wafer processing started because each incoming wafer at station 1 cools the chamber components, including the showerhead, as the wafer warms up to the process temperature. Thus the temperature curves in subsequent stations are progressively higher. Station 2 showerhead is cooler than station 3 showerhead because the incoming wafer to station 2 is cooler than the incoming wafer to station 3. For all stations, the showerhead temperature reached an equilibrium temperature after some time.

FIG. 1 shows that a wafer being processed in a multi-station chamber would experience a different showerhead temperature at each station. Thus when the showerhead temperature affects the film property deposited, each layer deposited on the wafer would have somewhat different properties. One example of a CVD process that is sensitive to showerhead temperature is the silicon nitride spacer. Another example of a CVD process that is sensitive to showerhead temperature is tetraethylorthosilicate (TEOS).

Figure 2A:
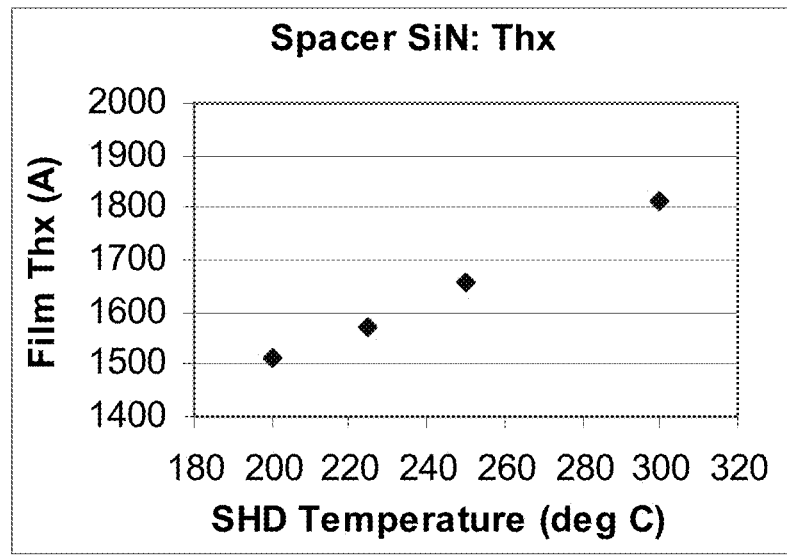
FIG. 2A is a graph of silicon nitride spacer thickness deposited at various showerhead temperatures.
Figure 2B:
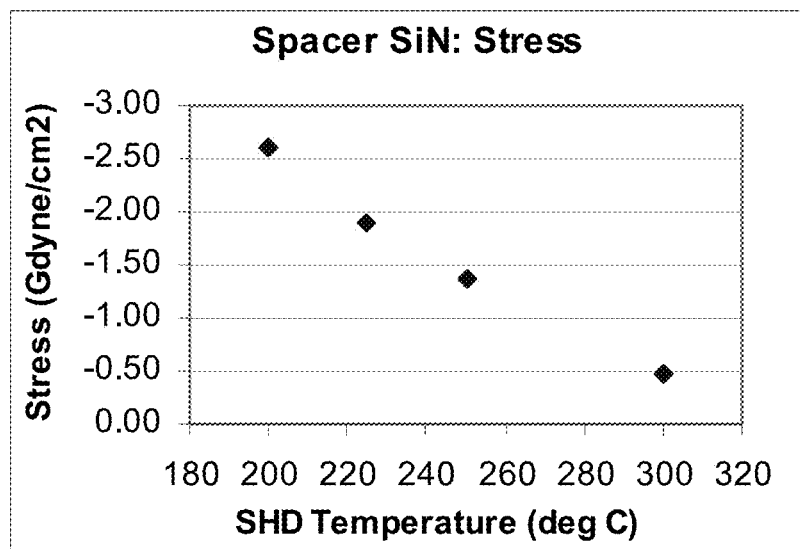
FIG. 2B is a graph of film stress for silicon nitride spacer deposited at various showerhead temperatures.

FIG. 2A shows the film thickness deposited under different showerhead temperatures. All other process parameters being equal, more film is deposited at higher showerhead temperatures. Thus the film thickness deposited at the beginning of a wafer run, e.g., after some idle time or chamber clean, would be less than the film thickness deposited after the showerhead temperature has reached equilibrium. Depending on the film, such thickness difference may or may not have an impact in the performance of the final device manufactured. FIG. 2B shows the showerhead temperature on a silicon nitride spacer film property—its stress. As the showerhead temperature increases, the stress decreases. Deposited film stress, especially at the transistor level, may have a big impact on device performance. Thus a desired stress may be achieved by manipulating showerhead temperature. The ability to control showerhead temperature would provide another process parameter with which to achieve desired film properties and reduce wafer-to-wafer variations (non-uniformity) in deposition thickness and film properties.

Temperature Controlled Showerhead

A temperature controlled showerhead improves wafer-to-wafer uniformity both for bulk film and individual sub-layers, increases throughput by eliminating non-processing delays, reduces particles by reducing or eliminating thermal cycling, and adds a valuable process parameter for fine-tuning film properties. The film wafer-to-wafer uniformity is improved because temperature varies less over a continuous batch of wafers (both within a batch and one batch to another and is independent of the tool condition). This reduces difference in film properties between the first wafer in a batch when the showerheads are cold and the last wafer in a batch when the showerheads have reached equilibrium temperature. By controlling all showerheads in a chamber to be at the same temperature, the film property uniformity in different sub-layers is also improved. Non-processing time, e.g., dummy deposition time to heat the showerhead, may be eliminated, thus increasing throughput. Thermal cycling may be reduced because the showerhead temperature may be maintained while the station is idle or being cleaned, instead of allowing the showerhead to cool. The reduction in thermal cycling would reduce the effect of different thermal expansion coefficients between chamber components and coatings on the components and thereby reduce particles. As discussed above, for some CVD processes, desired film properties may be achieved by controlling the showerhead temperature with other process parameters. For silicon nitride spacers with high stress, for example, low showerhead temperature is desirable.

There are generally two main types of CVD showerheads: the chandelier type and the flush mount. The chandelier showerheads have a stem attached to the top of the chamber on one end and the face plate on the other end, resembling a chandelier. A part of the stem may protrude the chamber top to enable connection of gas lines and RF power. The flush mount showerheads are integrated into the top of a chamber and do not have a stem. The present invention pertains to a temperature controlled chandelier type showerhead.

To control temperature, heat is added or removed based on the showerhead temperature. The showerhead temperature increases when the plasma is on, because (1) charged particles collide with the showerhead to impart energy, (2) the applied RF energy is coupled to the showerhead, and/or (3) external heat is intentionally added by, for example, electrical energy from an electrical heater. The showerhead temperature decreases when cooler material enters the chamber, e.g., reactant gases at lower temperature or wafers at ambient temperature, when heat is removed by conduction, e.g., heat conduction through the showerhead stem material up to the chamber ceiling, and by radiation from the showerhead surfaces. Some of these thermal events occur as a part of normal chamber operation, and others may be used to control showerhead temperature.

Figure 3A:
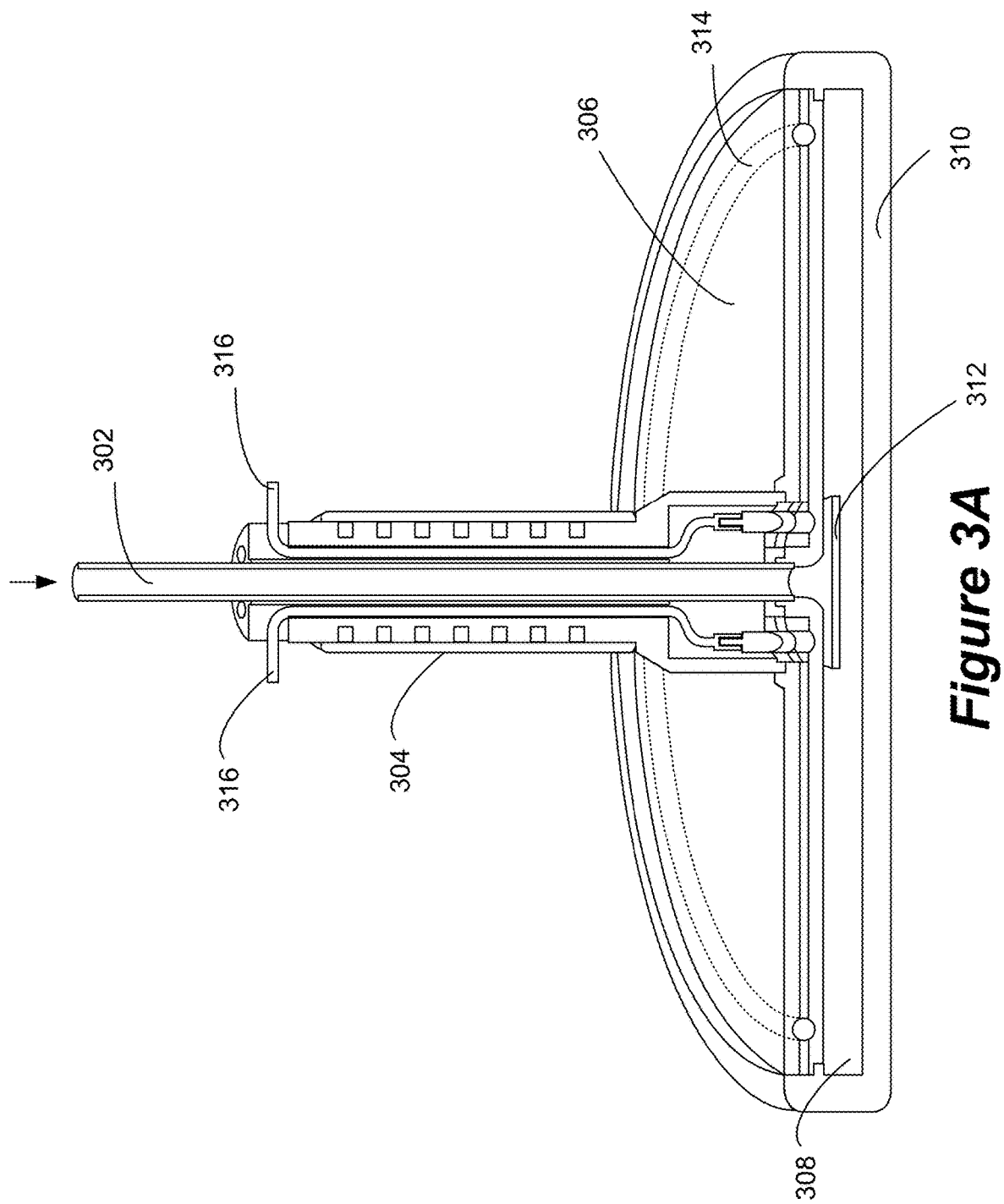
FIGS. 3A, 3B, and 3C are cross section schematics of a temperature controlled showerhead in accordance with various embodiments of the present invention.
Figure 3B:
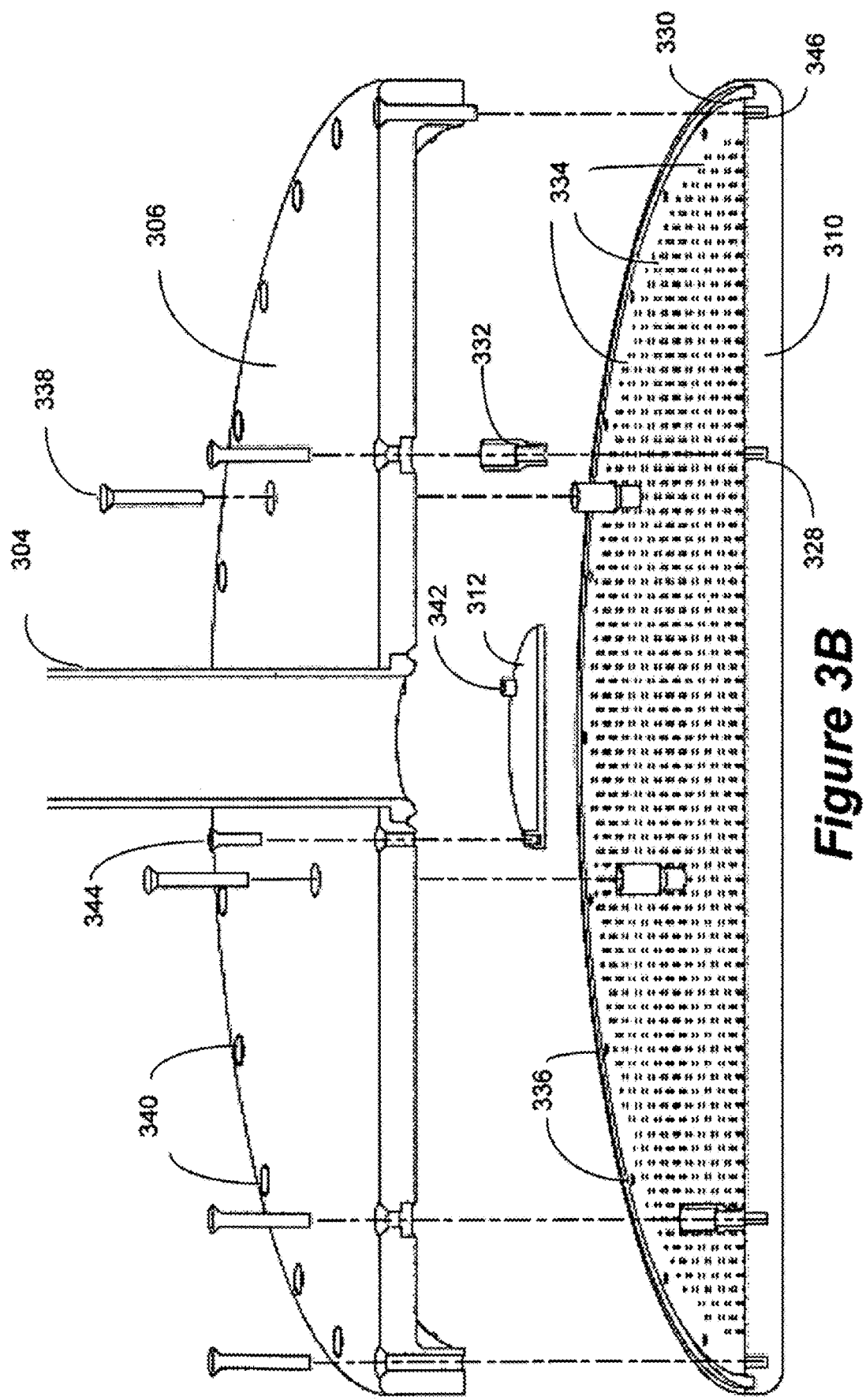
Figure 3C:
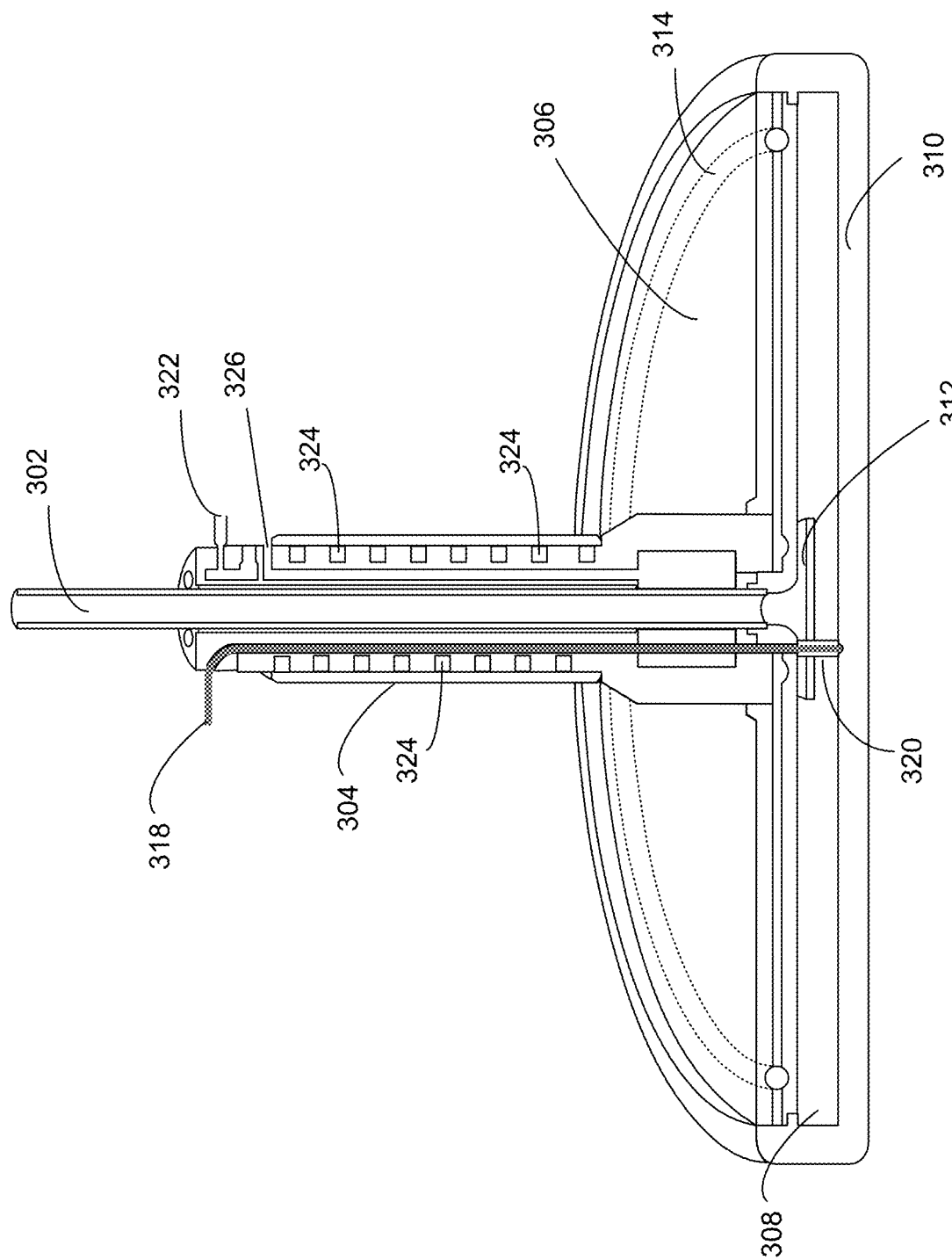

FIGS. 3A, 3B, and 3C are cross-section schematics of a showerhead in accordance with various embodiments of the present invention. Referring to FIG. 3A, the showerhead 300 includes a stem 304, a back plate 306, and a face plate 310. The stem 304 may be divided into an upper and a lower section, which may have different diameters. In one embodiment, the upper stem has a diameter of about 1.5 to 2 inches, preferably about 1.75 inches. The lower stem diameter is about 2 to 2.5 inches, preferably about 2.25 inches. The face plate diameter may be slightly larger and comparable or slightly larger than the wafer size, preferably about 100% to 125% of the wafer size. For example, for a 300 mm (12 inch) processing chamber the face plate diameter may be about 13 inches or about 15 inches. The face plate and back plate may each have a thickness of about 0.25 to 0.5 inches, or about 0.125 to 0.5 inches, or about 0.25-0.375 inches. The face plate may be made of an aluminum, anodized or coated aluminum, or other metal that is formulated to be high temperature, chemical and plasma resistant.

In one embodiment, the back plate is about 0.5 inches thick, and the face plate is about three eighths of an inch. Reactant gases are introduced through gas inlet channel 302 in the showerhead stem 304, flow past the back plate 306 and enter the manifold area 308 between the back plate 306 and the face plate 310. Referring to FIG. 3B, a baffle 312 distributes the gases evenly throughout the manifold area 308. The baffle 312 may be attached to the back plate 306 via threaded inserts or threaded holes 342 in the baffle plate and a number of screws 344. Volume of the manifold area is defined by the gap between the back plate and the face plate. The gap may be about 0.5 to 1 inch, preferably about 0.75 inch. To maintain uniform gas flow in the gap, the gap may be kept constant with a number of separator/spacers 332 positioned between the back plate and the face plate at various locations, e.g. 3, 6, or up to 10 locations. As shown, a screw 338 fastens the back plate 306 through separator/spacers 332, to the face plate at threaded blind holes 328. In other embodiments, variously shaped spacers or bushings with or without internal threads may be used. Although the screws shown enter the back plate and threads into the face plate, the reverse configuration may be used. For example, screws may be embedded in the face plate and enters a through hole in the back plate through a spacer. The screws may be fastened to the back plate with nuts.

The gases enter the processing area through perforations or holes (334) in the face plate 310 to cause a deposition on the surface of a wafer. The through holes may be machined, milled, or drilled. Each hole may be about 0.04 inch in diameter, or about 0.01 to 0.5 inches in diameter. Some holes may have different sizes. The number of holes may be 100-10,000, 2-5000, about 3-4000, or about 200-2000 holes. The holes may be distributed evenly throughout the face plate in various patterns, e.g., a honey comb pattern or increasingly larger circles. Depending on various factors including desired film uniformity, film profile and gas flow, the holes may have various patterns of non-even distribution, such as being more densely distributed in the middle of the face plate or more densely distributed at the edge of the face plate. In one embodiment, the holes may have a pattern of uniformly spaced circles with the holes placed increasingly apart further away from the center. Generally, various hole patterns and densities may be used.

In some cases, the face plate 310 is removably attached to the back plate 306 so that the perforation/hole configuration may be easily changed and the face plate cleaned. The back surface of the face plate 310 may include mating features to attach and detach from the back plate. As shown, the mating feature may be groove 330 and threaded blind holes 346. The groove 330 may mate onto corresponding lip on the back plate. Screw holes 340 on the back plate or face plate are positioned circumferentially and match holes 346. Screws attach the back plate and face plate together. The number of circumferentially positioned screws may be more than 4, more than 10, about 24, or up to about 50. Other mating features for the back plate and the face plate may be used. For example, other fastening mechanisms may include straps or clips or a simple friction based engagement may be used where the dimensions of the face plate closely matches those of a corresponding receptacle in the back plate. As shown in FIG. 3A, the face plate may include a circumferential sidewall having a ledge. The back plate may be positioned on the ledge and be attached with screws. In one embodiment, an interlocking jaw mechanism is used where specially machined notches on the circumferential sidewall edge of the back plate or face plate mate with teeth on the counterpart. The back plate and the face plate may become attached by friction when the showerhead is heated and the teeth and notches expand. Such mechanism involving non-moving parts may be preferable to screws which must be threaded and may strip and release particles. Yet another possible mechanism involves threads on a circumferential sidewall of the face plate or the back plate that can screw into a respective counterpart. Regardless of the mating feature and fastening mechanism, the back plate and face plate are attached in such way to maintain good electrical and thermal contact between them.

During operation, a showerhead face plate experiences stressful conditions in the chamber. For example, thermal stress from the temperature changes up to very high temperatures, e.g., above 300° C., can warp the back plate or the face plate and degrade the material. Plasma during operation can erode surface material, causing particles and weak spots. Reactants can also corrode the face plate in a chemical attack, e.g. fluorine gas. Unwanted deposition of reaction products or by products can clog the gas flow holes affecting process performance, cause particles when a film builds up on the surface, or affect plasma properties in the case of aluminum fluoride. Cumulatively, these events may affect process performance in terms of particles, uniformity, and plasma performance. The ability to clean or replace just the face plate is cost effective without having to replace the entire showerhead assembly.

Referring again to FIG. 3A, a heater 314 may be thermally attached to the back plate 306. The heater 314 may be an electrical heater and may be embedded in the back plate 306. The heater may be attached by a vacuum brazing process. The heater coil 314 is controlled by heater wires 316 that are connected to the coil through the stem. Because the showerhead is subjected to high RF energy during chamber operation, all or part of the heater is insulated and isolated from the RF. The RF isolation may be accomplished through an EMI/RFI filter or any other commercially available RF isolation device. In some embodiments, the heater is not used.

FIG. 3C shows a slightly different cross section of the showerhead to emphasize other elements. A thermocouple 318 is in thermal contact with face plate 310 to measure the face plate temperature. The thermocouple 318 is connected from the upper stem through a standoff 320 between the back plate 306 and face plate 310. At the face plate 310, the thermocouple may contact the face plate material in a thermocouple contact hole. Similar to the heater wire and elements, the thermocouple is also insulated and isolated from the RF. The RF isolation may be accomplished through an RF trap at a frequency and an RF filter at another frequency. In other embodiments, other temperature sensing devices may be used to measure the temperature of the face plate. Particularly, a non-contact temperature sensor may be used. Examples include pyrometry, fluorescence-based thermometry and infrared thermometry.

The temperature controlled showerhead enhances heat removal by conduction, convection and radiation. Heat is conducted away through the showerhead stem itself, which is connected to a chamber top. The stem diameter may be designed to maximize conductive heat loss to the chamber top. Heat is also removed by convection through cooling fluids flowing in a convective cooling fluid passageway in the stem 304. The embodiment in FIG. 3B includes a cooling fluid inlet 322, into which cooling fluids, e.g., clean dry air (CDA), argon, helium, nitrogen, hydrogen, or a mixture of these, may be flowed. The fluid may follow a helical path down the stem. The helical path is shown in FIG. 3B through openings 324 of the convective cooling fluid passageway. The cooling fluid may exit the stem through one or more cooling fluid exit channels 326. In one embodiment, two cooling fluid exit channels are provided. Although the example here uses a helical passageway and two exit channels, one skilled in the art may design another tortuous passageway to effectively transfer heat from the showerhead to the cooling fluid.

The fluid cooling channels may be designed so that the exiting fluid is completely heated up to the temperature of the showerhead stem. Because the faceplate temperature and stem temperature are correlated, it is possible to deduce the faceplate temperature by measuring the temperature of the exiting fluid. The exiting fluid temperature may be measured away from the electromagnetic interference caused by the RF. This design may avoid the use of a thermocouple inside the showerhead and its associated RF filtering circuitry.

In another scenario, the cooling fluid may further be modulated to control the amount of cooling. A feedback loop based on the exiting fluid temperature may increase or decrease the flow to change the amount of cooling. This cooling may be in addition to or instead of heat on the back plate. For less demanding applications, the cooing alone may be used to control the showerhead temperature; and, the heater elements and RF isolation devices may be omitted. For more demanding application, the modulation of cooling fluid is an additional parameter to control the showerhead temperature.

In addition to conduction and convection, heat may radiate away from the showerhead from the back plate. To improve radiative cooling, the external surface of the back plate may be coated with a high emissivity material. For example, the coating may be anodized aluminum. The radiation may be absorbed by the top of the chamber. The chamber top may also be treated with a high emissivity material to increase radiative heat transfer. The inside surface of the chamber top may be coated with anodized aluminum. The chamber top may be cooled independently, e.g., with cooling water lines.

The conductive and radiative heat removal keeps the showerhead at low enough temperatures whereby the electrical heater can accurately heat it back. Without the heat removal, the showerhead temperature would remain high and uncontrollable. The heat removal creates headroom for temperature control. In one embodiment, the heat removal keeps the showerhead temperature below about 200° C. The heater is a simple coil around the perimeter of the back plate because most of the heat transfer between the face and back plate is around the perimeter. Better thermal contact between the showerhead and back plate also improves temperature control because conductive heat transfer, and thus heat loss through the stem, is enhanced.

Cooling System

Figure 4:
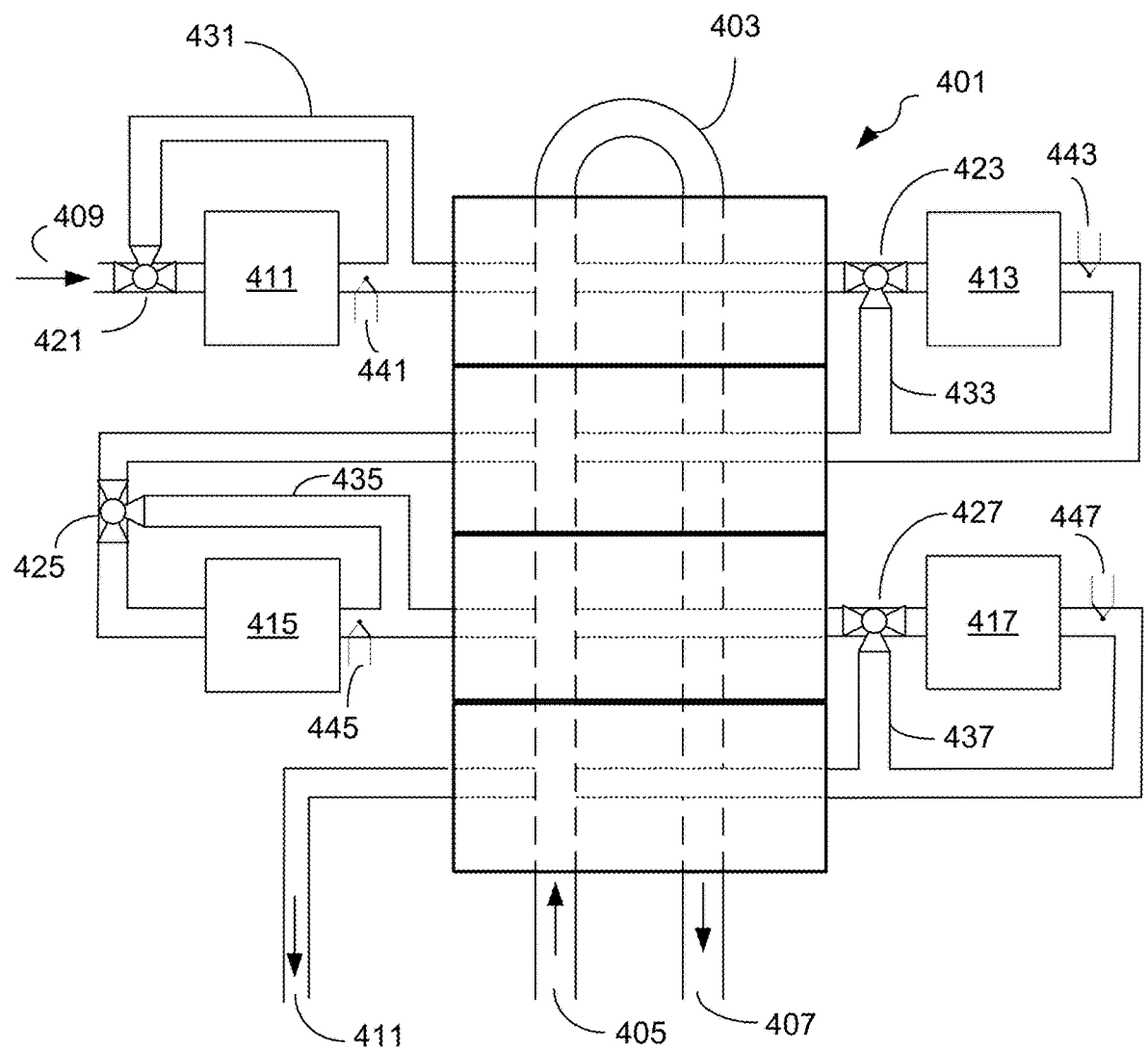
FIG. 4 is a schematic of a cooling system in accordance with an embodiment of the present invention.

A cooling system connected to one or more showerhead stems cools the convective cooling fluid that flows through each showerhead stem. The cooling system includes a liquid cooled heat exchanger and connections to the showerheads. FIG. 4 is schematic of a cooling system in accordance with one embodiment of the present invention. In this embodiment, a heat exchanger 401 is connected to four showerheads 411, 413, 415, and 417. The convective cooling fluid flows serially through each showerhead and a compartment of the heat exchanger 401. The convective cooling fluid enters the system at inlet 409 where it enters the first showerhead stem. After flowing through one showerhead, the convective cooling fluid is cooled by a liquid coolant in the heat exchanger before flowing through the next showerhead. After the last cooling through a last compartment in the heat exchanger, the convective cooling fluid is exhausted from the cooling system at outlet 411. The convective cooling fluid may be clean dry air (CDA), argon, helium, nitrogen, hydrogen, or a combination of one or more of these. In one embodiment, the convective cooling fluid is facilities provided CDA at a facilities pressure. A different flow rate may be required for different facilities pressures. For example, at facilities pressure of 80 psi, 100 standard liters per minute (slm) of CDA may be used. The exhaust may be at about or slightly above ambient temperature and pressure. Although an open system is shown where the convective cooling fluid does not return to the system, the concept of serial flow through the showerhead and intermediate cooling through one heat exchanger also may be implemented with a closed system.

In some embodiments, exiting cooling fluid temperature from the showerhead is measured and used to determine the showerhead temperature. Temperature sensor 441, 443, 445, and 447 may be thermally coupled to the exiting cooling fluid and yet be outside the range of RF interference. This configuration would eliminate the need for an RF filtering device. As discussed above, the convective cooling passageways may be designed so that the exiting cooling fluid temperature is the same as that of the showerhead stem. One skilled in the art would then be able to devise algorithms to correlate measured exiting fluid temperatures to showerhead temperatures knowing thermal properties of the various components.

In certain embodiments, the showerhead may not include a heater attached to the back plate. The showerhead temperature increases during processing, preheating, and remote plasma cleaning. In these embodiments, active cooling from the cooing fluid may be used to control showerhead temperature. Control valves 421, 423, 425, and 427 controls the flow of cooling fluids to the showerhead based on input from the controller. The cooling fluid either flows to the showerhead stem or is diverted in a bypass loop 431, 433, 435, or 437. More or less cooling may be accomplished based on the flow of cooling fluids to the showerhead. An active cooling only design may be appropriate in certain less demanding applications where the range of acceptable showerhead temperatures is larger. In these embodiments, the showerhead temperature may be determined based on the exit cooling fluid temperature or be measured at the showerhead through a contact thermocouple or through a non-contact thermal sensing means.

In one embodiment, four showerheads and four compartments are shown in FIG. 4, but the cooling system may be designed with another number of showerheads and compartments. In some cases, the cooling system may serve to cool the showerheads for more than one semiconductor processing tool. If each semiconductor processing tool has one multi-station chamber with four stations each, a cooling system having 8 compartments connecting to 8 showerheads may be designed to serve 2 tools. Some semiconductor processing tools may have more than one multistation chamber. In that case a cooling system may be designed to serve all the showerheads in more than one chamber on a single tool. If a four compartment heat exchanger is used on a tool having more than one four-station chamber, more than one heat exchanger per tool may be used.

In some cases one or more of the showerhead may be bypassed for convective cooling fluid flow altogether. Thus each showerhead connection may also include a bypass loop with corresponding valves. For certain processes, not every station may be configured to deposit material onto the wafer or require a temperature controlled showerhead. In that case the bypass loop may be used at station 4.

The liquid coolant for the heat exchanger 401 enters the system at inlet 405 and follows a coolant path 403 before it exits the system at outlet 407. Although only one loop is shown for coolant path 403, the coolant path may consist of many loops depending on the diameter of the coolant path, heat transfer required, the coolant temperature at the inlet, and any coolant temperature requirements at the exit. The liquid coolant may be water or any other type of known liquid coolant, e.g., Freon. In one embodiment, the liquid coolant is facilities delivered water. After exiting the heat exchanger, the liquid coolant may or may not be treated further before being released, for example, into the drain. For example, the facilities delivered water as the liquid coolant may be exhausted directly. However, if other liquid coolant is used, the coolant may be compressed and recirculated back into the heat exchanger, creating a closed-loop coolant system.

Different designs of the heat exchanger 401 may be utilized. FIG. 4 shows a cross-flow heat exchanger where the currents run approximately perpendicular to each other. However, counter-flow or parallel-flow heat exchangers may be used. One skilled in the art would be able to design a heat exchanger with enough surface area to cause desired heat transfer. In certain embodiments, the heat exchanger 401 may be a cast metal enclosing the liquid coolant and convective cooling fluid piping. The metal may be aluminum or other metal with desired heat transfer characteristics. The cast metal design allows for a compact heat exchanger with little footprint or space requirement.

Temperature Control System

Figure 5:
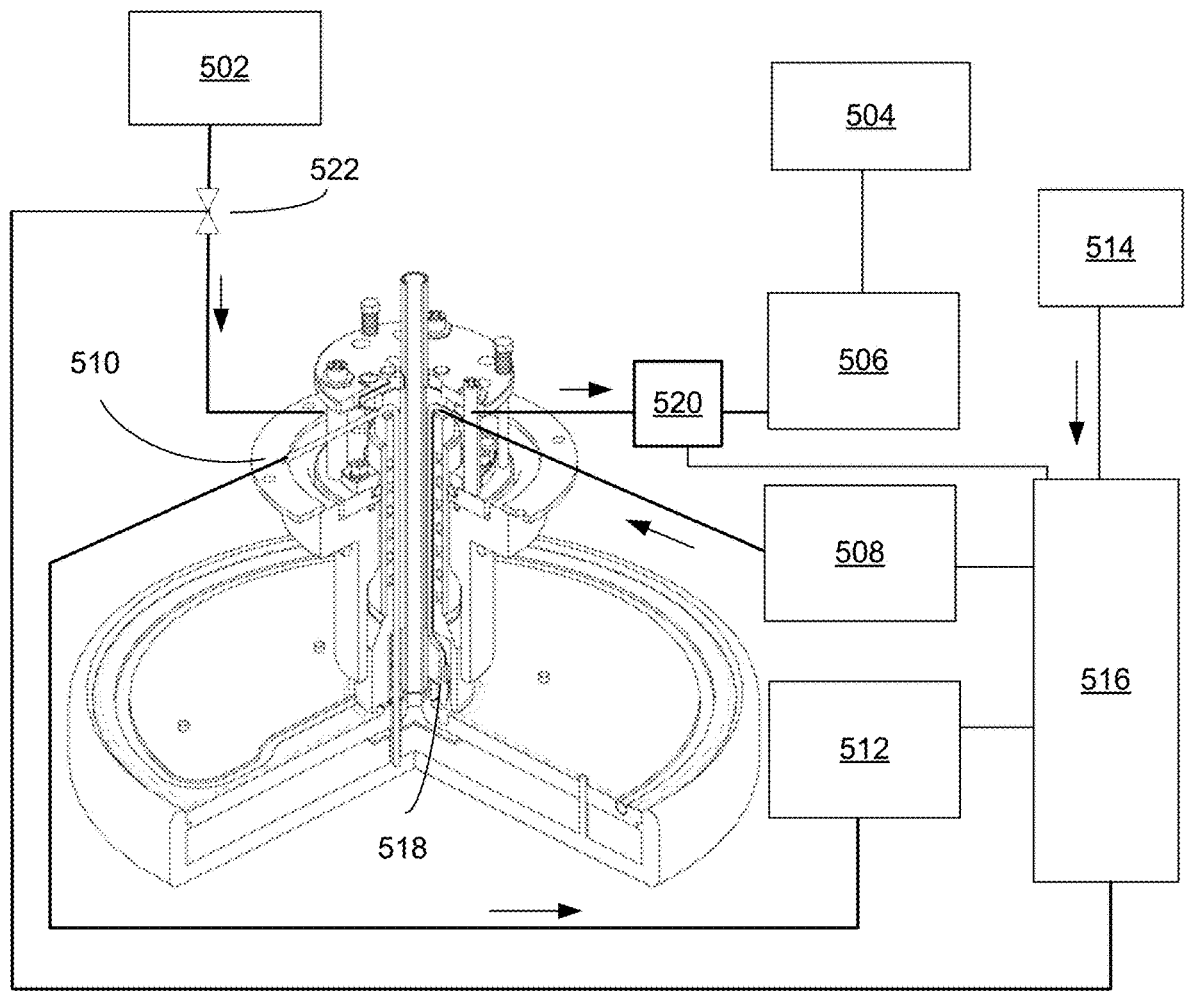
FIG. 5 is a schematic of a temperature control system in accordance with an embodiment of the present invention.

The showerhead temperature control system includes one or more showerheads, the cooling system, and controllers for controlling the temperature of each showerhead. FIG. 5 depicts the major components of the temperature control system as it relates to one showerhead. Note that showerhead graphic in this figure includes the attachment parts to the chamber top. Convective cooling fluid flows from component 502 into the showerhead stem where it is heated in the process of cooling the showerhead, and exits to the heat exchanger 506. In some embodiments, the cooling fluid flow into the showerhead is modulated by a control valve or other flow modulator 522. By modulating the flow, the cooling provided by the cooling fluid may be increased or decreased.

From the heat exchanger 506, as discussed above, the convective cooling fluid may be flowed to another component, such as 504. If the showerhead is configured as the first station in a chamber, then component 502 may be the facilities air and component 504 may be another showerhead, such as station showerhead. If the showerhead is not configured as the first station, then component 502 and 506 may be the same component, the liquid cooled heat exchanger as discussed above. Note that this cooling loop may not have a feed back loop where more or less cooling may be adjusted. The simple design merely cools the showerhead enough such that the electric heater 518 may accurately heat the showerhead to a certain temperature.

Thermocouple 510 is in physical contact with the face plate, as discussed above. Thermocouple 510 is connected to a RF isolation device 512 to remove the effect of RF applied on the showerhead as an electrode from the thermocouple signal. Typically, the RF applied in a PECVD has two frequency components, a high frequency (e.g., 13.56 MHz) trap and a low frequency (e.g., 400 kHz). The RF isolation device may include one or more filters. In one embodiment, the RF isolation device includes a high frequency and a low frequency filter. Without RF isolation, it is believed that the thermocouple measurement would not be useful because the RF interference would be too great.

Figure 6:
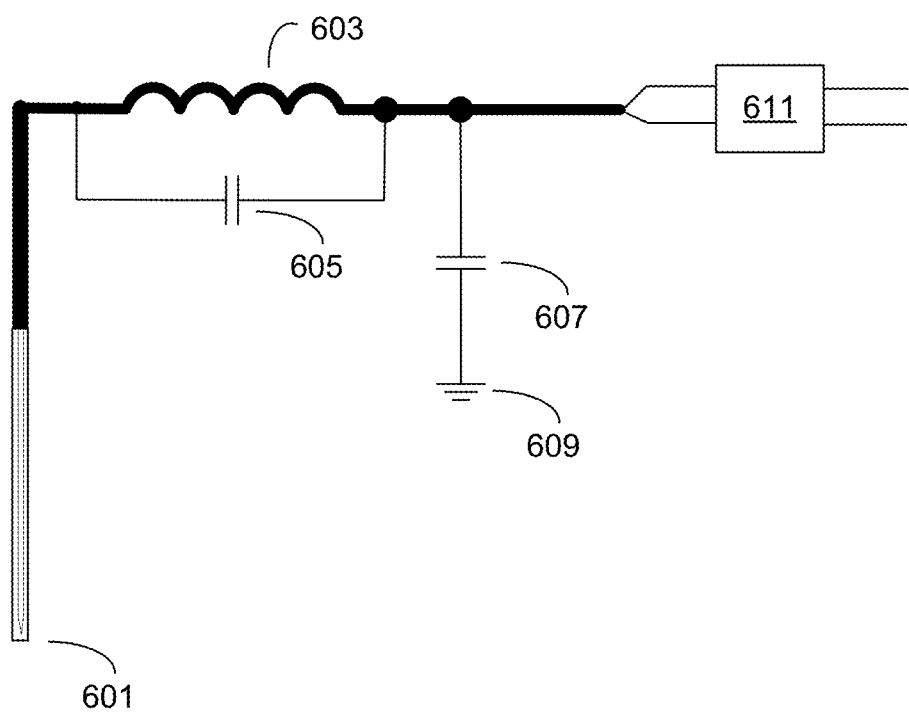
FIG. 6 is a schematic of one embodiment of RF filters to reduce or eliminate RF noise.

A schematic of a possible configuration of the RF isolation device is shown in FIG. 6. The thermocouple 510/601 is surrounded by a stainless steel sheath. This sheath is wound to a coil 603 in parallel to a capacitor 605. The coil as an inductor and the capacitor forms a tank circuit which blocks the 13.56 MHz signal. The coil may have an inductance of about 1 microhenry, and capacitor 605 may have a capacitance of about 85 pf (picofarads). Remaining 13.56 MHz RF is shorted to ground 609 with the second capacitor 607, which may have a capacitance of about 10000 pf. Trapping the high frequency with the sheath also blocks the RF in the thermocouple wires embedded in this sheath. The 400 kHz frequency is not blocked by the 603/605 filter and due to its lower frequency not shorted to ground by the capacitor 607. So at the end of the 13.56 MHz filter there is still 400 kHz noise that is subsequently filtered out by the low frequency filter 611. In one design, the low frequency filter may be a two-stage low pass filter. Both stages may be a LC design similar to the high frequency filter. Please note that the low frequency filter may be connected directly to the thermocouple wires, but the high frequency filter may be connected to the sheath only.

Referring again to FIG. 5. the heater element 518 is connected to its RF isolation device 508. RF isolation device 508 may be an RF filter or other available device to isolate the heater electrical signals from the effects of the RF applied. The temperature controller 516 reads the temperature information from the thermocouple 510 through the isolation device 512, and adjusts input to the heater 518 through the RF isolation device 508 in a feed back loop.

In another embodiment, the exit cooling fluid temperature may be measured by a temperature sensing device 520 that is outside of the range of RF interference. In this embodiment, no RF filter is required for the temperature sensing device 520. The controller may correlate the exit cooling fluid temperature to a showerhead temperature.

The temperature controller 516 may also takes feed forward information from component 514. The feed forward information may be that the time period until the plasma turns on. In some cases the feed forward information may also include other predictable events that affect the showerhead temperature such as wafer processing with cold wafers, gas flow into the showerhead. The controller may increase the heater input in anticipation of a cooling event, e.g., chamber purge, or decrease the heater input in anticipation of a heating event, e.g., plasma "on." The controller may also increase the cooling by increasing cooling fluid flow in anticipation of a heating event or decrease the cooling by decreasing cooling fluid flow in anticipation of a cooling event.

Various combinations of the input and output components may be used in different controlling schemes. For example, active cooling (modulating cooling fluid flow) may be used with active heating (heater in the back plate) to accurately control showerhead temperature. The showerhead temperature may be measured directly from a thermocouple attached to the face plate, or determined indirectly from the exiting cooling fluid temperature. In some cases, only active cooling or only active heating may be included in the control system. Still other inputs may be included, such as temperature sensing of the cooling fluid at the inlet to accurately determine the heat removed from the showerhead.

In certain embodiments, the temperature controller may be integrated with the system controller. In those cases component 514 would not be separated from controller 516.

Experimental

Figure 7:
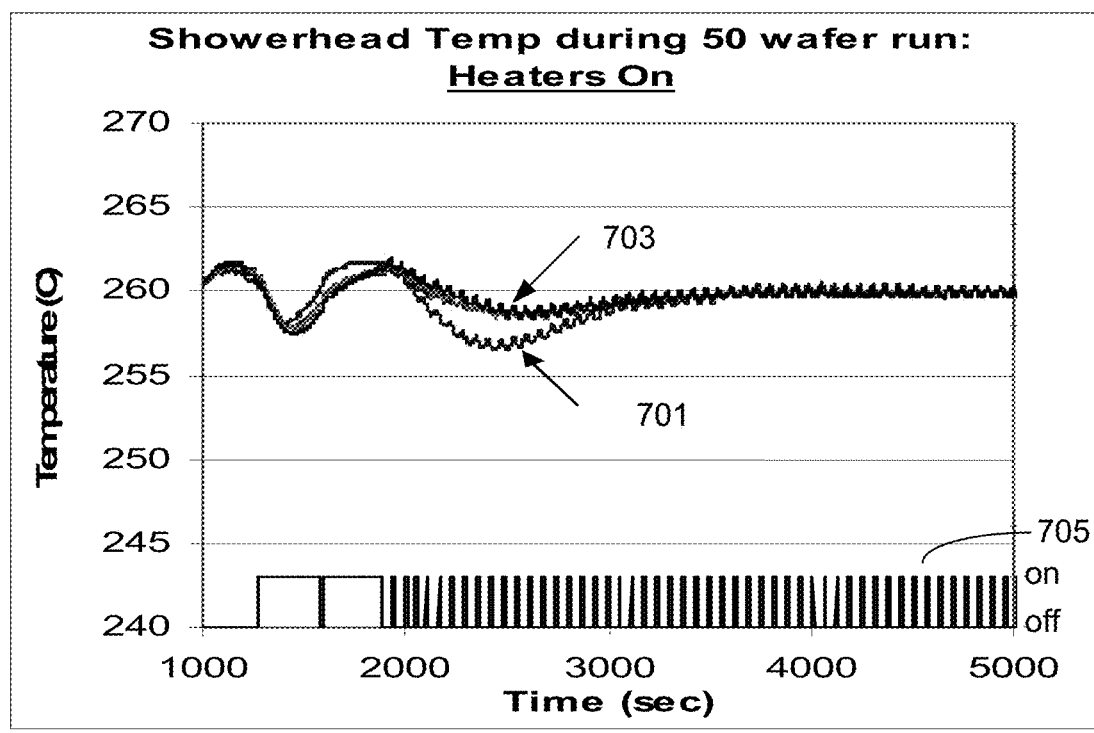
FIG. 7 is a plot of showerhead temperatures measured using a temperature controlled showerhead in accordance with the present invention.

A showerhead temperature control system was implemented in accordance with the present invention. The control system implemented included the temperature controlled showerheads as discussed above and a controller that uses only feed back (thermocouple only) input. The showerhead temperatures for a four-station chamber were measured over a 50 wafer run and plotted in FIG. 7. Temperatures for each showerhead, four in all, are plotted on separate curves. The set point was 260° C. Temperature measured for station 1 is noted as line 701. Temperature measured for stations 2-4 are very close to each other and noted as lines 703. Just like FIG. 1, the plasma condition is plotted also as a step function at 705.

The difference in showerhead temperatures as compared to FIG. 1 where the heater is off and temperature is not controlled is dramatic. During the dummy deposition up to about 1800 seconds, the showerhead temperature behaved similar to that of FIG. 1. The temperatures quickly stabilized after wafer deposition started, at about time 1800 seconds. At least for showerheads in stations 2-4, the temperature stabilized much sooner. Station 1 temperature 701 trended downwards for a period of about 500 seconds, down to about 256° C., but recovered and remained at the set point during remaining of the wafer processing.

The data shows that with the temperature control scheme, showerhead temperatures may be controlled to without about 4° C. within a 50 wafer batch. Because the data was generated without using feed forward control, implementation including feed forward control may improve the response to even less than about 4° C.

In another test, wafer-to-wafer results of deposition rate for Tetraethylorthosilicate (TEOS) deposition were studied using a standard showerhead and a temperature controlled showerhead in accordance with the present invention. The standard showerhead does not include the temperature controlled features of the present invention. It does not include the cooling mechanisms or the heater. In order to test the responsiveness of the temperature controlled showerhead to changing conditions, 100 wafers were deposited with each showerhead under four conditions. Before each condition, the process chamber was subjected to a remote plasma clean (RPC) where a plasma is ignited from gases fed into a chamber that is located remotely from the processing chamber. Plasma-activated species from the RPC chamber then flow through a delivery line towards the processing chamber. Thus a RPC was conducted before wafers 1, 26, 51, and 76. In the first condition, TEOS was deposited for 12 seconds per wafer and thickness deposited were measured. In the second condition, after the RPC the showerhead was cooled with nitrogen gas from the reactant channel for 20 minutes. It is estimated that in the standard showerhead, after about 20 minutes of forced cooling with nitrogen gas the showerhead temperature reached about 240° C. In the third condition, the process chamber was idled overnight after the RPC. During this idle, the pedestal remains heated to about 350° C., so that in the standard showerhead over this duration the showerhead equilibrated to a temperature less than 350° C. In the fourth condition, after the RPC the showerhead was heated with a high power plasma for 20 minutes. Nitrogen is used to generate this plasma at a flowrate of about 10 slm. The chamber pressure was maintained at about 2.5 Torr and the high frequency power at about 1500 watts.

Figure 8A:
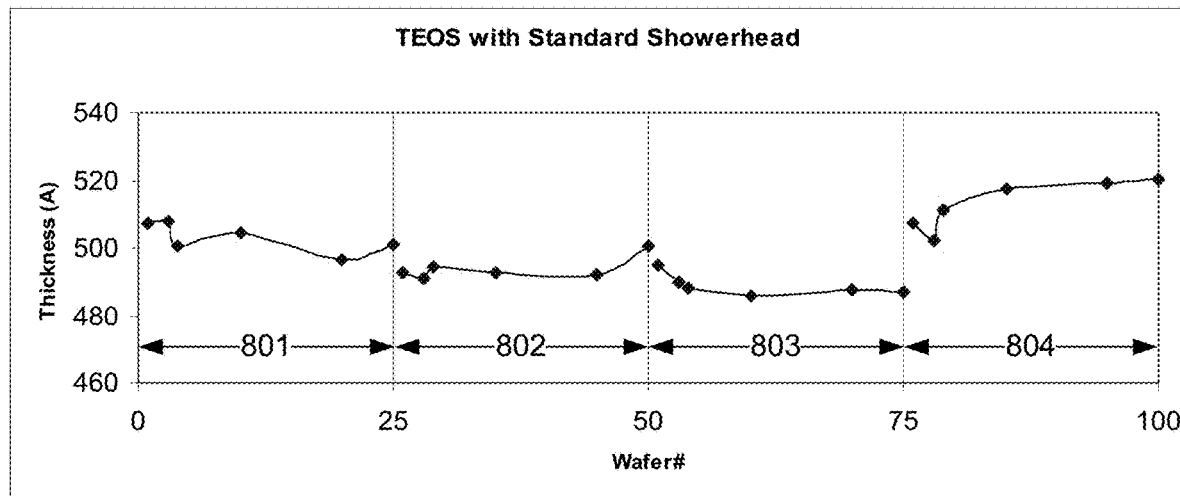
FIG. 8A is a plot showing TEOS film thickness over 100 wafers with four different starting conditions using a standard showerhead.
Figure 8B:
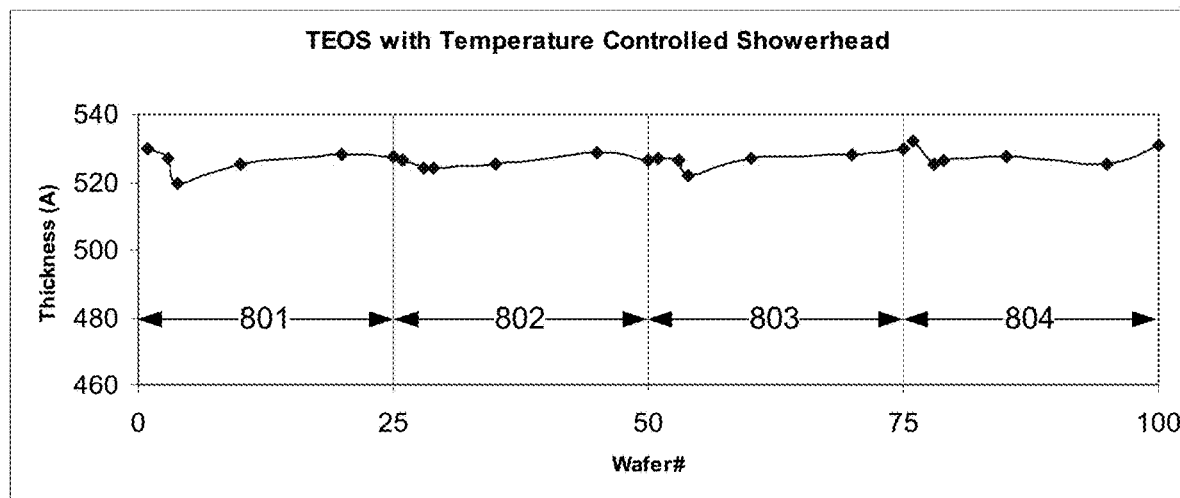
FIG. 8B is a plot showing the TEOS film thickness over 100 wafers with the same four starting conditions using temperature controlled showerheads.

FIGS. 8A and 8B are plots of the thickness deposited in angstroms for each wafer measured. Six wafers were measured for each condition. Regions 801 correspond to the first condition, discussed above. After the RPC, the showerhead temperatures are elevated because exothermic reactions released energy at the showerhead surface. The standard showerhead remained hotter for longer without additional cooling that is possible in the temperature controlled showerhead, as shown by the thickness data. Note that TEOS deposition rate is higher at higher showerhead temperatures. After a few wafers, depositions at both the standard showerhead and the temperature controlled showerhead decreased, then slowly increased. The temperature controlled showerhead maintained a relatively stable deposition rate, but the deposition rate started to decrease again for the standard showerhead. It is believed that the second decrease in the standard showerhead station is attributed to the effect of cold wafers entering the station, much like the temperature decrease shown on curve 102 of FIG. 1. The data shows that after a RPC sequence, the temperature controlled showerhead was able to equilibrate to a constant temperature, and hence a deposition rate, faster than the standard showerhead.

Regions 802 correspond to the second condition. After the RPC sequence the process chamber was cooled with nitrogen. In this region the deposition with temperature controlled showerhead was affected less initially—there was less of a drop in deposition thickness than the standard showerhead. Regions 803 correspond to the third condition. After overnight idling, the deposition with the temperature controlled showerhead had the same characteristics as that after a RPC sequence. The deposition dips initially and regained relatively constant value. The deposition with the standard showerhead decreased over the initial wafers and also maintained a relatively constant value. Note that although the deposition parameters are the same, the standard showerhead maintained a lower deposition rate in region 803 than all the other regions. Lastly, regions 804 correspond to the fourth condition. High energy plasma after the RPC sequence heated the showerhead to a higher temperature than RPC alone. In the standard showerhead, the highest deposition rates were recorded in region 4. After an initial dip in deposition, the thickness appeared to equilibrate at a higher value. In the temperature controlled showerhead, the high energy plasma appeared not to affect the deposition, save perhaps for the very first wafer.

Overall, the range of thicknesses measured for the standard showerhead was about 37 angstroms and for the temperature controlled showerhead, only about 13 angstroms. The wafer-to-wafer non-uniformity for the deposition was 3.7% for the standard showerhead and 1.3% for the temperature controlled showerhead. The better wafer-to-wafer uniformity for the temperature controlled showerhead is a 66% improvement over that of the standard showerhead.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A temperature-controlled, chandelier-type showerhead comprising:

i) a stem comprising a convective cooling fluid passageway, wherein the stem is configured to be connected with a semiconductor processing chamber;

ii) a back plate thermally coupled to the stem; and iii) a face plate thermally coupled to the back plate;

wherein: the stem has a first end that is configured to connect with or protrude through a top of the semiconductor processing chamber when the temperature-controlled, chandelier-type showerhead is installed in the semiconductor processing chamber, the back plate is configured to be supported within the semiconductor processing chamber by the stem, the convective cooling fluid passageway includes an inlet and an outlet, and the inlet and the outlet are both located in the first end.

2. The temperature-controlled, chandelier-type showerhead of claim 1, further comprising a temperature sensor configured to measure a temperature of cooling fluid exiting the convective cooling fluid passageway.

3. The temperature-controlled, chandelier-type showerhead of claim 2, wherein the temperature sensor is a thermocouple.

4. The temperature-controlled, chandelier-type showerhead of claim 1, wherein an external surface of the back plate includes a coating to increase emissivity.

5. The temperature-controlled, chandelier-type showerhead of claim 4, wherein the coating is anodized aluminum.

6. The temperature-controlled, chandelier-type showerhead of claim 1, further comprising a heater physically attached to the back plate.

7. The temperature-controlled, chandelier-type showerhead of claim 1, wherein the face plate is removably attached to the back plate.

8. The temperature-controlled, chandelier-type showerhead of claim 1, wherein at least part of the convective cooling fluid passageway follows a helical path within the stem.

9. The temperature-controlled, chandelier-type showerhead of claim 1, further comprising a gas inlet channel located within the stem and in fluidic communication with a manifold area located between the back plate and the face plate.

10. The temperature-controlled, chandelier-type showerhead of claim 9, wherein the convective cooling fluid passageway encircles the gas inlet channel when viewed along the center axis of the gas inlet channel.

11. The temperature-controlled, chandelier-type showerhead of claim 9, wherein the face plate includes a plurality of through-holes that provide a fluidic path between the manifold area and an exterior surface of the face plate.

12. The temperature-controlled, chandelier-type showerhead of claim 11, wherein the number of through-holes falls within a range selected from the group of ranges consisting of: between 100 and 10,000 through-holes, between 2000 to 5000 through-holes, between 3000 to 4000 through-holes, and 200 to 2000 through-holes.

13. The temperature-controlled, chandelier-type showerhead of claim 11, wherein the through-holes have diameters of between 0.01 inches to 0.5 inches.

14. The temperature-controlled, chandelier-type showerhead of claim 11, wherein the through-holes have diameters of about 0.04 inches.

15. The temperature-controlled, chandelier-type showerhead of claim 9, wherein the manifold area may be defined by a gap between the face plate and the back plate of between about 0.5" to 1".

16. The temperature-controlled, chandelier-type showerhead of claim 14, wherein the gap is about 0.75".

17. The temperature-controlled, chandelier-type showerhead of claim 9, further comprising a baffle plate interposed between the back plate and the face plate and centered on the center axis of the gas inlet channel.

18. The temperature-controlled, chandelier-type showerhead of claim 9, wherein the gas inlet channel is fluidically isolated from the convective cooling fluid passageway within the stem.

19. The temperature-controlled, chandelier-type showerhead of claim 1, wherein the face plate includes a circumferential side wall having a ledge and the outer perimeter of the back plate contacts the ledge.

20. A semiconductor processing tool comprising:
   a chamber having a chamber top; and
   the temperature-controlled, chandelier-type showerhead of claim 1, wherein the temperature-controlled, chandelier-type showerhead is connected with the chamber top via the stem.

* * * * *